US00RE36014E

United States Patent [19]

Dedic

[11] E Patent Number: Re. 36,014

[45] Reissued Date of Patent: Dec. 29, 1998

[54] VOLTAGE STORAGE CIRCUITS

[75] Inventor: Ian J. Dedic, Northolt, United Kingdom

[73] Assignee: Fujitsu Limited, Kawasaki, Japan

[21] Appl. No.: 788,030

[22] Filed: Jan. 23, 1997

Related U.S. Patent Documents

Reissue of:

[64] Patent No.: 5,384,570
Issued: Jan. 24, 1995
Appl. No.: 115,986
Filed: Sep. 3, 1993

[30] Foreign Application Priority Data

Sep. 8, 1992 [GB] United Kingdom ..... 9218987

[51] Int. Cl.[6] ..... H03M 1/12

[52] U.S. Cl. ..... 341/172; 341/155

[58] Field of Search ..... 341/136, 150, 341/155, 172; 330/7, 9, 51, 156

[56] References Cited

U.S. PATENT DOCUMENTS

| | | | |
|---|---|---|---|
| 4,136,335 | 1/1979 | Tompsett . | |
| 4,276,513 | 6/1981 | Johnston et al. | 330/9 |
| 4,307,382 | 12/1981 | Feldmann et al. . | |
| 4,570,121 | 2/1986 | Carbrey . | |
| 4,611,196 | 9/1986 | Fernandez | 340/347 |
| 4,719,448 | 1/1988 | Yoshimura et al. . | |
| 4,894,657 | 1/1990 | Hwang et al. | 341/158 |
| 4,922,130 | 5/1990 | Swerlein . | |
| 5,291,074 | 3/1994 | Nayebi . | |
| 5,341,037 | 8/1994 | Miki et al. . | |

FOREIGN PATENT DOCUMENTS

| | | |
|---|---|---|
| 0 020 160 | 12/1980 | European Pat. Off. . |
| 0 024 277 | 2/1981 | European Pat. Off. . |
| 0 078 600 | 5/1983 | European Pat. Off. . |
| 0 078 601 | 5/1983 | European Pat. Off. . |
| 0 240 682 | 10/1987 | European Pat. Off. . |
| 0 435 600 A2 | 7/1991 | European Pat. Off. . |
| 0 214 831 | 12/1991 | European Pat. Off. . |
| 0 521 349 A2 | 1/1993 | European Pat. Off. . |
| 2 625 388 | 6/1989 | France . |
| 228 131 | 10/1985 | Germany . |
| 1168712 | 10/1969 | United Kingdom . |
| 1 247 880 | 9/1971 | United Kingdom . |
| 1 522 276 | 8/1978 | United Kingdom . |
| 2 145 889 | 4/1985 | United Kingdom . |
| 2 249 233 A | 4/1992 | United Kingdom . |
| 2 264 011 A | 8/1993 | United Kingdom . |

OTHER PUBLICATIONS

1992 Amplifier Reference Manual, Analog Devices, Inc., 1992, pp. 2–375 and 2–380.

Linear Technology Corporation, "Linear Data Book 1990", Milpitas, CA 1989, pp. 2–308, 2–310 and 2–336.

"3 States Logic Controlled CMOS Cyclic A/D Converter Is Used In MB87020," K. Gotoh et al., Fujitsu Facts. 1987.

*Primary Examiner*—Brian K. Young
*Attorney, Agent, or Firm*—Staas & Halsey

[57] ABSTRACT

A voltage storage circuit, for use for example in an analogue-to-digital converter, includes an input switch element connected between an input node (IN) of the circuit and a first plate of a storage capacitor. The other plate of the capacitor is connected to a common terminal 3 of the circuit. A high-impedance amplifier element is connected to the first plate for providing at an output node (OUT) of the circuit an output voltage ($V_o$) dependent upon the first plate potential ($V_c$). The amplifier element has an FET input device whose gate electrode is connected to the first plate and whose source and drain electrode potentials are fixed in relation to the first plate potential ($V_c$). Such a voltage storage circuit avoids charge injection to/from the amplifier element, with consequential charging/discharging of the storage capacitor, which would otherwise result from operation of the amplifier element

66 Claims, 10 Drawing Sheets

FIG. 14
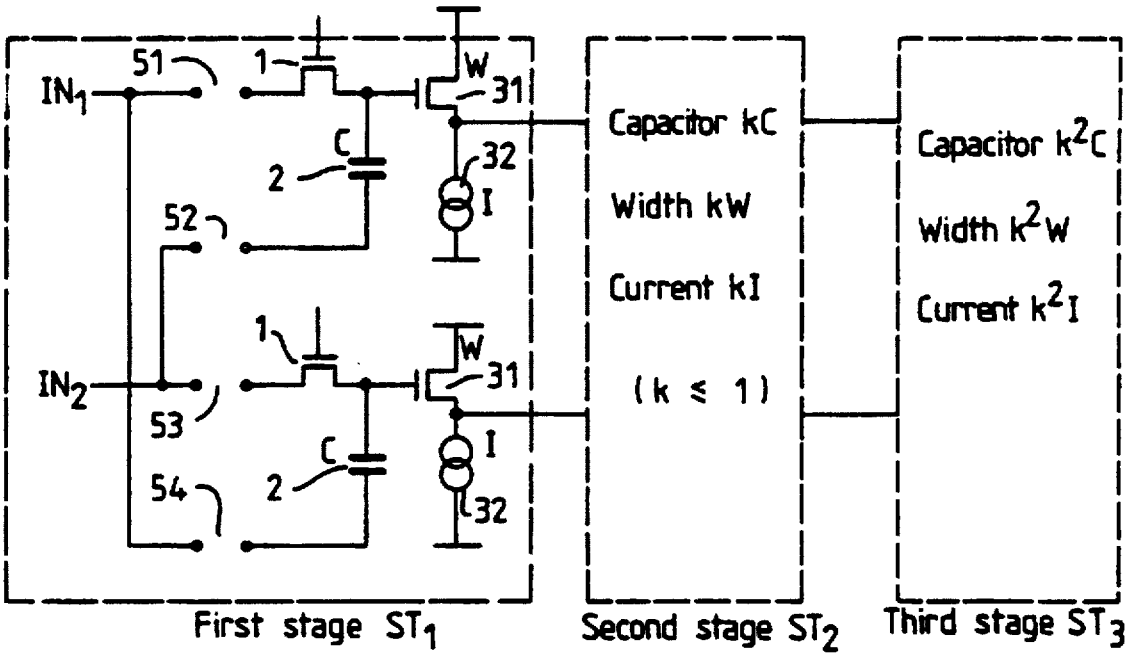
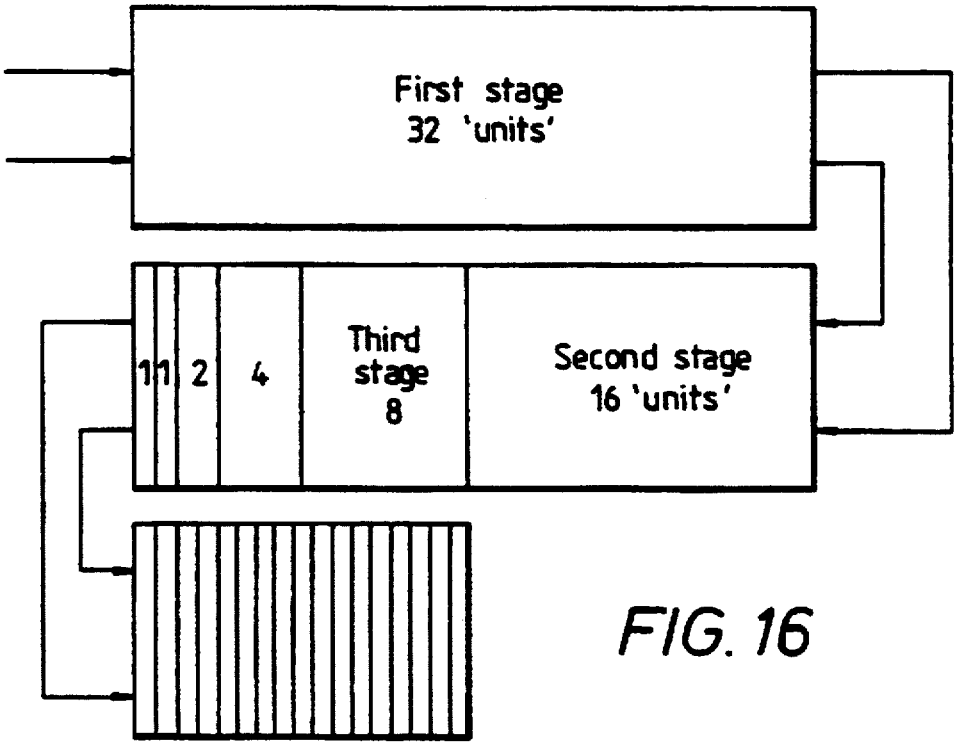
FIG. 16

VOLTAGE STORAGE CIRCUITS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to voltage storage circuits for use, for example, in analog-to-digital converters for storing an applied analog value prior to conversion into its digital equivalent.

2. Description of the Prior Art

FIG. 1 of the accompanying drawings shows a previously-considered voltage storage circuit comprising an input switch element 1, a storage capacitor 2 and a high-impedance unity-gain amplifier element 3. Initially, with the switch element 1 in the closed position, an analog input voltage $V_i$ applied between input terminals of the circuit is supplied to the storage capacitor 2 so that the potential difference between the plates of the storage capacitor tracks the input voltage $V_i$. At a predetermined moment in time $t_{switch}$ the input switch element 1 is switched to the open position, with the result that the potential difference between the capacitor plates immediately prior to such switching is stored until such time as the input switch element 1 is closed again. During the period in which the switch element is in the open position the stored voltage is reproduced between output terminals of the circuit as an output voltage $V_o$, the amplifier element 3 serving to prevent loading of the storage capacitor by circuitry connected with the output terminals.

FIG. 2 shows an input portion of the amplifier element 3 in more detail. This input portion includes an FET input transistor 33 having a drain electrode connected to a positive supply line $V_{dd}$ of the element, a source electrode connected by way of a current source 32 to a negative supply line $V_{ss}$ of the element, and a gate electrode connected to one plate (the upper plate in FIG. 1) of the storage capacitor 2. It will be appreciated that the FET input transistor 33 is connected in the so-called source follower configuration.

Further circuitry, not shown in FIG. 2, is normally interposed between the source electrode of the FET input transistor 33 and an output of the element for buffering the source electrode potential to produce the output potential $V_o$.

In use of the amplifier element 3 of FIG. 2, the current source 32 causes a current to flow in the drain/source channel of the FET input transistor 33, with the result that the source electrode potential $V_s$ thereof follows the gate electrode potential and hence the stored potential $V_c$ of the upper plate of the storage capacitor 2. Thus, the input portion of the amplifier element 3 has a voltage gain of substantially unity, although in practice the source electrode potential $V_s$ is always slightly less than the potential $V_c$ of the upper plate of the storage capacitor 2.

Because the input portion employs an FET input transistor the gate current of which is very small, the input impedance of the element is very high. Thus, after the input switch element 1 of the voltage storage circuit of FIG. 1 has been opened, the storage capacitor is not discharged to a significant extent by the amplifier element 3.

The amplifier element 3 of FIG. 2 suffers, however, from a disadvantage arising from charge injection into its input portion from the storage capacitor 2 (or vice versa) when the potential of the upper plate $V_c$ of the storage capacitor 2 is changed. Although after the input switch element 1 has been opened, no such change in the upper plate potential will normally result, as explained later in the present specification the upper plate potential $V_c$ unavoidably changes at the moment $t_{switch}$ of opening of the input switch element 1 due to charge injection at that moment by the input switch element 1 itself. Such charge injection by the input switch element 1 leads to a small, but at high precision significant, change in the stored voltage in the storage capacitor 2 and hence brings about a change in the potential $V_c$ of the upper plate thereof at the moment the switch element is opened.

The reasons for charge injection at the amplifier element input portion, in response to changes in the upper plate potential of the storage capacitor 2, will now be explained. As shown in FIG. 2, the FET input transistor 33 unavoidably has small parasitic capacitances between its electrodes, there being a gate-source parasitic capacitance $C_{gs}$ between the gate and source electrodes, a gate-drain parasitic capacitance $C_{gd}$ between the gate and drain electrodes, and a drain-source parasitic capacitance $C_{ds}$ between the drain and source electrodes. Whenever the potentials of these three electrodes change relative to one another, charge must flow into or out of the parasitic capacitances, and it is the combination of these charge flows which leads to charge injection to/from the amplifier element input portion.

In the FIG. 2 amplifier element, because the input transistor 33 is connected in the above-mentioned source follower configuration, the gate-source potential thereof is substantially constant, irrespective of the upper plate potential $V_c$ of the storage capacitor 2, so that charge injection due to the gate-source parasitic capacitance $C_{gs}$ can normally be neglected.

However, the gate potential and the drain-source potential of the input transistor 33, being $V_{dd}-V_c$ and $V_{dd}-V_s$ respectively, are not constant and vary in dependence upon the upper plate potential $V_c$. Thus, whenever $V_c$ is changed, charge must flow into or out of the gate-drain parasitic capacitance $C_{gd}$ and the drain-source parasitic capacitance $C_{ds}$, in either case causing charge to flow into or out of the input portion of the amplifier element.

When the input switch element is open, the charge that flows must either charge or discharge the storage capacitor 2, depending upon the direction of flow. Such charge or discharge unavoidably leads to an error in the stored voltage between the plates of the storage capacitor 2.

The effects of the parasitic capacitances of the input portion of the amplifier element are particularly severe when the capacitance of the storage capacitor 2 is not large relative to the capacitances of the parasitic capacitances themselves, which may be the case for example when it is desired to reduce acquisition time of the voltage storage circuit.

BRIEF SUMMARY OF THE INVENTION

According to a first aspect of the present invention there is provided a voltage storage circuit including:

a storage capacitor, one plate of which is connected to an input terminal of the circuit by way of an input switch element and the other plate of which is connected to a common terminal of the circuit, an input signal to be stored being applied between the said input and common terminals when the circuit is in use; and in amplifier element, having an input connected to the said one plate and an output connected to an output terminal of the circuit, for providing an output signal, between the said output and common terminals, dependent upon the voltage stored in the said storage capacitor, which amplifier element includes an electronic input device having a controllable current path provided between respective first and second current-path electrodes of the device and also having a control electrode to which a potential is applied to control the magnitude of current in the said current path, the said control electrode being connected to the said one plate, and the said first and second current-path electrodes being connected with potential tracking means such that both the first current-path electrode potential and the second current-path electrode potential track the control electrode potential, whilst current flows in the said controllable current path, so that the respective potentials of the first and second current-path electrodes are kept substantially fixed in relation to the potential of the said one plate.

With such a design of amplifier element, the potentials of the control and first and second current-path electrodes of the input device are all in substantially fixed relation to one another and to the one plate potential when the circuit is in use, so that the parasitic capacitances existing between those electrodes do not significantly affect operation of the circuit. This avoids charge injection to/from the amplifier element, with consequential charging/discharging of the storage capacitor, due to operation of the amplifier element connected to the said one plate of the storage capacitor. Thus, error in the stored voltage as a result of such charging/discharging is eliminated.

Preferably the potential tracking means include a current source, connected to the said first current-path electrode for causing the first current-path electrode potential to track the control electrode potential, and active follower means connected operatively between the said first and second current-path electrode for causing the second current-path electrode potential to track the first current-path electrode potential.

In such an arrangement the first current-path electrode is caused to track the one plate potential automatically, so that the active follower means can be connected operatively between the first and second current-path electrodes, i.e. exclusively on the output side of the input device, to achieve the required tracking of the second current-path electrode.

The said electronic input device is advantageously an FET input transistor such that the said control electrode is the gate electrode of the FET input transistor, the first current-path electrode is the source electrode of the FET input transistor, the said second current-path electrode is the drain electrode of the FET input transistor, and the said controllable current path is provided by the drain-source channel of the FET input transistor.

Such an FET input transistor provides the amplifier element with a high input impedance, so as to avoid discharge of the storage capacitor after the input switch element has been opened, the inevitable gate-source, gate-drain, and source-drain parasitic capacitances of the FET input transistor not affecting the circuit operation.

When the input device is an FET, the said active follower means may comprise a cascoding FET transistor connected with its drain-source channel in series with the drain-source channel of the FET input transistor so that the source electrode potential of the cascoding transistor tracks the gate electrode potential thereof and also comprise a bias generator connected operatively between the source electrode of the FET input transistor and the gate electrode of the cascading transistor for maintaining therebetween a substantially constant potential difference.

Such a cascoding arrangement is simple but effective, the series-connection of the cascoding FET transistor with the FET input transistor ensuring that the source electrode potential of the cascading transistor automatically tracks the gate electrode thereof.

The amplifier element is preferably made up of first and second substantially identical circuit portions, the first portion including the said input device and the said active follower means and the second portion including the said current source.

Such circuit symmetry can provide high stability and predictability in the operation of the amplifier element, particularly as regards the relationship between the input and output potentials of the amplifier element, and can be conveniently fabricated.

The said input switch element is preferably an electronic input switch element, operative in dependence upon the potential at a switching electrode thereof, the circuit further including switch driving means connected to cause the switching electrode potential to track the input terminal potential when the element is in its ON condition, thereby maintaining the switching electrode potential substantially fixed in relation to the input terminal potential, and operable to cause the switching electrode potential to change, relative to the input terminal potential, such that the element is changed from its ON condition to its OFF condition.

In such a circuit the control electrode potential is fixed in relation to the input term potential, so that the amount of charge injected in the electronic switch element at the moment of switching OFF is substantially independent of the level of the input signal. Thus, error in the stored voltage due to such charge injection is substantially constant, or at least linear, for different input signal voltages, and appropriate measures can therefore be taken to compensate for such error.

The said switching electrode potential is advantageously derived from the said output signal so that this potential can be obtained without loading or otherwise affecting the input signal.

Advantageously, the said switch driving means are connected operatively with the said output terminal and are operable, in dependence upon a switching signal received thereby, to apply to the said switching electrode either an ON potential, for maintaining the said input switch element in its ON condition, or an OFF potential, for maintaining the said input switch element in its OFF condition, the said ON and OFF potentials being each substantially fixed in relation to the said output terminal potential but differing from one another by a predetermined amount.

In this arrangement both the ON and OFF potentials are fixed relative to the input signal potential so that the charge injection by the input switch element is substantially constant irrespective of the input signal potential.

The voltage storage circuit may well have respective first and second biassing lines connected operatively to the said output terminal so as to be at potentials that are respectively fixed in relation to the output terminal potential, the second biassing line potential being equal to one of the said ON and OFF potentials and the potential difference between the said first and second biassing lines being greater than or equal to the said predetermined amount. In this case the said switch driving means may include a bootstrap capacitor one plate of which is connected to the said switching electrode for providing the said switching electrode potential and also include connecting means connected with both plates of the bootstrap capacitor and with the said biassing lines and switchable, when the switching electrode potential is to be changed from the said one of its ON and OFF potentials to the other of those potentials, from a charging configuration, serving to connect the said one plate of the bootstrap capacitor to the said second biassing line whilst connecting the other plate thereof to the said first biassing line, to a floating configuration serving to isolate the said one plate from the second biassing line whilst connecting the said other plate to the said second biassing line, thereby to cause the potential at the said one plate to be changed from the second biassing line potential to a potential differing therefrom by the said predetermined amount.

In such an arrangement one of the ON and OFF potentials can be outside the supply lines of the circuit, if necessary.

Alternatively, the voltage storage circuit may have respective first, second and third biassing lines connected operatively to the said output terminal so as to be at potentials that are respectively fixed in relation to the output terminal potential, the third biassing line potential being equal to one of the said ON and OFF potentials and the potential difference between the said first and second biassing lines being greater than or equal to the said predetermined amount. In this case the said switch driving means may include a bootstrap capacitor one plate of which is connected to the said switching electrode for providing the said switching electrode potential and also include connecting means connected with both plates of the bootstrap capacitor and with the said biassing lines and switchable, when the switching electrode potential is to be changed from the said one of its ON and OFF potentials to the other of those potentials, from a charging configuration, serving to connect the said one plate of the bootstrap capacitor to the said third biassing line whilst connecting the other plate thereof to the said first biassing line, to a floating configuration serving to isolate the said one plate from the third biassing line whilst connecting the said other plate to the said second biassing line, thereby to cause the potential at the said one plate to be changed from the third biassing line potential to a potential differing therefrom by the said predetermined amount.

In this example, the required change in the [control] *switching* electrode potential, from the said output terminal potential when the switch element is in one of its ON and OFF conditions to a potential differing from the output terminal potential by the said predetermined amount when the switch element is in the other of its ON and OFF conditions, can be achieved using internal biasing lines whose potentials are not suitable for directly providing the ON and OFF potentials and/or whose potentials differ from the output terminal potential by less than the predetermined amount.

Preferably the said electronic input switch element is a MOSFET transistor in which case one of the said ON and OFF potentials can be substantially the same as the said output terminal potential. For example, if the MOSFET transistor is an n-channel enhancement type MOSFET, the OFF potential can be substantially the same as the output terminal potential. With such a MOSFET transistor as the electronic switch element the generation of suitable ON and OFF potentials can be desirably simple, particularly in the case of the said one of the ON and OFF potentials that can be obtained by simply applying the output terminal potential directly to the [control] *switching* electrode.

Preferably the voltage storage circuit is formed on a single substrate, and the said input switch element and the said input device of the amplifier element are located within one or more wells of the conductivity type opposite to that of the surrounding material of said substrate, there being means for causing the or each well potential to track the potential of the said one plate. By controlling the potential of the well in this way, parasitic capacitances (including the switch element capacitance and any interconnect capacitance) of the circuit can be bootstrapped out. The well may, for example, be connected electrically to the said output terminal of the circuit. This permits the well potential to track the output terminal potential.

The said storage capacitor may also located within such a well to bootstrap parasitic capacitances associated therewith.

Advantageously, one or more conductive shields extend over the area of the or each well, and there are means for causing the or each shield potential to track the potential of the said one plate. This assists in eliminating residual parasitic capacitance effects. In such a case, the said conductive shield may also usefully be connected electrically to the said output terminal of the circuit so that the shield potential tracks the output terminal potential.

When the amplifier element of the voltage storage circuit comprises two substantially identical circuit portions as described above, the said first portion of the amplifier element is preferably located within the said one or more wells, and the said second portion of the amplifier element is formed within one or more further wells, each of the conductivity type opposite to that of the surrounding areas of the substrate, the or each further well potential being substantially fixed in relation to the potential of a supply line of the circuit.

The voltage storage circuit preferably further includes input potential maintaining means, interposed between the said input terminal and the input side of the said input switch element, for maintaining the input-side potential of the input switch element, after the element is changed to the OFF condition, substantially fixed in relation to the potential of the said one plate of the storage capacitor.

This can prevent the input switch element from becoming turned ON inadvertently should the input signal potential change sufficiently relative to the [control] *switching* electrode potential after the element has been turned OFF.

The said input potential maintaining means may comprise a further switch element connected in series with the said input switch element and operable, after the said input switch element has been changed to the OFF condition, to isolate the input side of that element from the said input terminal. In this way, variation in the input signal potential after opening of the further switch element does not affect the input side potential of the input switch element.

The said input potential maintaining means may further comprise an auxiliary capacitor connected between the input side of the said input switch element and the said other plate of the said storage capacitor and/or a feedback switch element connected between the said amplifier element and the input side of the said input switch element and operable, while the input side of that element is so isolated, to apply thereto a potential derived from the potential of the said one plate of the storage capacitor.

The gain of the said amplifier element is preferably substantially unity. In this case the [control] *switching* electrode potential and the well potential(s) can conveniently be "bootstrapped" to the output terminal potential because, when the amplifier element has a gain of substantial unity, the buffered output terminal potential is substantially equal to the one plate potential/input signal potential. Thus, the required [control] *switching* electrode potential can be derived from the buffered output signal without affecting the input signal.

Such a voltage storage circuit (the amplifier element of which has unity gain) as described above may usefully be included in voltage summation circuitry which also includes:

first, second and third input nodes to which first, second and third potentials are applied when the circuitry is in use;

an output node connected with the output terminal of the voltage storage circuit; and switching means connected with the said input nodes and with the said voltage storage circuit and switchable, after the input switch element of the voltage storage circuit has been changed to the OFF condition, from an input configuration to an output configuration, said input configuration serving to connect the said first and second input nodes to the said input and common terminals respectively of the voltage storage circuit, thereby to permit storage of the potential difference between the said first and second potentials in the storage capacitor of the voltage storage circuit, and said output configuration serving to connect the common terminal of the voltage storage circuit to the said third input node, thereby to produce at the said output node an output potential which is substantially equal to the sum of the third potential and the stored difference between the first and second potentials.

Such voltage summation circuitry is capable of very high precision voltage summation, the accuracy being essentially limited only by the effectiveness with which the effects of parasitic capacitances in the voltage storage circuit can be eliminated. When, in each voltage storage circuit, the various parasitic capacitances of the circuit (the switch element capacitance, the amplifier element input capacitance and any interconnect capacitance) are bootstrapped out using the techniques indicated above, substantially the only limit on cancellation of parasitic capacitance effects arises from gain error of the amplifier elements. This gain error can be reduced to very low levels by adopting suitable designs of the amplifier element.

First and second voltage storage circuits, each as described above and each having unity-gain amplifier elements, may be advantageously included in voltage summation circuitry which also includes:

first, second, third, fourth, fifth and sixth input nodes, a first pair of input voltages being applied to the said first and second input nodes, and a second pair of input voltages being applied to the said third and fourth input nodes, and a third pair of input voltages being applied to the said fifth and sixth input nodes, when the circuitry is in use;

first and second output nodes connected with the respective output terminals of the said first and second voltage storage circuits; and switching means connected with the said input nodes and with the said voltage storage circuits and switchable, after the respective input switch elements of the first and second voltage storage circuits have been changed to the OFF condition, from an input configuration to an output configuration, said input configuration serving to connect the said first and second input nodes to the said input and common terminals respectively of the said first voltage storage circuit, and also to connect the said third and fourth input nodes to the said input and common terminals respectively of the said second voltage storage circuit, thereby to permit storage, in the said storage capacitor of the first voltage storage circuit, of a first potential difference between the two input voltages of the said first pair and to permit storage, in the said storage capacitor of the second voltage storage circuit, of a second potential difference between the two input voltages of the said second pair, and said output configuration serving to connect the respective common terminals of the first and second voltage storage circuits to the fifth and sixth input nodes respectively, thereby to produce between the said first and second output nodes a pair of output voltages the potential difference between which is substantially equal to the sum of the potential difference between the two input voltages of the said third pair and the difference between the stored first and second potential differences.

By virtue of the back-to-back connection of the two voltage storage circuits the individual (fixed) amounts of charge injected by the respective switch elements thereof at the moment they are turned OFF are the same for each circuit and hence effectively cancel one another out bearing in mind the differential nature of the input and output of the circuitry.

First and second voltage storage circuits, each as described above and each having unity-gain amplifier elements, may in another preferred example be included in voltage doubling circuitry which also includes:

first and second input nodes between which an input voltage to be doubled is applied when the circuitry is in use;

first and second output nodes connected respectively with the respective output terminals of the first and second voltage storage circuits; and switching means connected with the said input nodes and with the said voltage storage circuits and switchable, after the respective input switch elements of the first and second voltage storage circuits have been changed to the OFF condition, from an input configuration to an output configuration, said input configuration serving to connect the said first input node to both the said input terminal of the said first voltage storage circuit and the said common terminal of the said second voltage storage circuit, and also to connect the said second input node to both the said input terminal of the said second voltage storage circuit and the said common terminal of the said first voltage storage circuit, thereby to cause each of the respective storage capacitors of the said voltage storage circuits to be charged to the said input voltage, and said output configuration serving to connect the respective common terminals of the first and second voltage storage circuits together so that the said storage capacitors are connected in series with one another between the [said first and second output nodes, thereby to produce between those] *respective amplifier-element inputs of said first and second voltage storage circuits, thereby to produce between the first and second* output nodes an output voltage which is substantially double the said input voltage.

Again, the back-to-back connection of the two voltage storage circuits affords cancellation of the charge injected by the input switch elements, so that the doubled voltage is highly accurate. The circuitry has a much improved speed/power/noise trade-off, perhaps up to ten times better, than comparable prior proposals.

Such voltage doubling circuitry has a particularly advantageous application in analog-to-digital converters that carry out voltage doubling operations in the course of their conversion operations. Such a converter may incorporate a voltage conversion stage including:

voltage doubling circuitry as described above;

comparator means connected for receiving a working voltage equal to or derived from the said input voltage and also connected for receiving a comparison potential and operable to perform a comparison between that working voltage and the said comparison potential and to provide digital data indicative of the result of the comparison; and voltage adjustment means connected between the respective common terminals of the said first and second voltage storage circuits and operable, after the said switching means have been switched from the said input configuration to the said output configuration, to apply between those terminals an offset voltage having a value selected, by the said digital data, from a plurality of preset possible values, thereby to produce between the said output nodes an analogue conversion voltage which differs from double the said input voltage by the selected offset voltage.

In such a conversion stage, by virtue of the use of high-precision voltage doubling circuitry as described above, the analogue conversion voltage can be derived with desirably high precision from the input voltage without the use of complex switching arrangements to interconnect the two storage capacitors. This analogue conversion voltage can be offset, from double the input voltage, by one of a number of preselected offset voltages selected in dependence upon the input voltage magnitude, as is required for example in analogue-to-digital converters of the "three-state-logic" kind. The said voltage adjustment means are connected between the respective common terminals of the said first and second voltage storage circuits and are operable to apply between those terminals the said offset voltage. In this way, since the voltage adjustment means are connected in series with the two storage capacitors so as to cause a potential difference equal to the selected offset voltage to exist between the respective said other plates of the capacitors, and each storage capacitor has a potential difference between its respective plates equal to the input voltage, the required offset of the analogue conversion voltage from double the input voltage is achieved simply and accurately, without employing complex and inaccurate analogue voltage adders.

Preferably the said comparator means perform the said comparison whilst the switching means of the voltage storage circuits are in the said input configuration, providing high-speed operation.

In one preferred example, the said comparator means are connected to the said first and second input nodes, so that the said input voltage is the said working voltage, and provide first such digital data if the said input voltage is less than or equal to minus the said comparison potential, and provide second such digital data if the said comparison potential is less than or equal to the said input voltage, and provide third such digital data in all other cases, and wherein the offset voltage selected by the said second digital data is $-V_{ref}$, where $+V_{ref}$ is the offset voltage selected by the said first digital data, and the offset voltage selected by the said third digital data is zero; the said comparison potential being substantially equal to $V_{ref}/4$.

By virtue of the immunity of the conversion algorithm embodied in such a conversion stage to missing code errors that would otherwise arise from offset voltage of the comparator means, the full benefit of the improvement in the precision of the voltage conversion operation performed by the stage is obtained in terms of overall conversion accuracy.

One particularly-advantageous such analogue-to-digital converter comprises:

a series of N stages, each being a voltage conversion stage as described above, an analogue voltage to be digitised being applied between the said first and second input nodes of the first stage of the series, and the said first and second input nodes of each successive stage being connected to the said first and second output nodes respectively of the immediately-preceding stage;

control means operable to cause the switching means of each of the said stages in succession to be switched from the said input configuration to the said output configuration, such switching being controlled to occur in each of the stages, except for the first stage, at a time when the switching means of the immediately-preceding stage is in the output configuration so that prior to such switching the stage being switched receives as its input voltage the analogue conversion voltage produced by that immediately-preceding stage and so produces its analogue conversion voltage in dependence thereupon after such switching; and data processing means connected for receiving the said digital data provided by the said N stages and operative to derive therefrom a digital output word, comprising N+1 bits, representative of the applied analogue voltage.

Such an analogue-to-digital converter can operate very quickly, producing one full N+1 bit digital output word per clock period.

Preferably, such an analogue-to-digital converter is operative alternately in first and second clock phases, and the said control means operate in the said first clock phase to maintain the respective switching means of the odd-numbered stages of the series in the input configuration whilst maintaining the respective switching means of the even-numbered stages in the said output configuration but operate in the said second clock phase to maintain the respective switching means of the even-numbered stages in the said input configuration whilst maintaining the respective switching means of the odd-numbered stages in the output configuration.

This arrangement permits the converter to operate at the above-mentioned high speed while keeping the control of the stages desirably simple.

Advantageously, for at least one pair of adjacent stages of the series, the respective storage capacitors of the said first and second voltage storage circuits in the second stage of the pair are smaller in capacitance than the comparable storage capacitors in the first stage of the pair, the storage capacitance ratio of the two stages of one or each such pair being preferably approximately 2:1. This can assist in reducing power consumption of the converter.

For at least one pair of adjacent stages of the series, the respective amplifier element input devices of the said first and second voltage storage circuits in the second stage of the pair are preferably smaller in width than the comparable input devices in the first stage of the pair, the input device width ratio of the two stages of one or each such pair being advantageously approximately 2:1, again to reduce power consumption.

Furthermore, for at least one pair of adjacent stages of the series, the respective currents in the controllable current paths of the amplifier element input devices of the said first and second voltage storage circuits in the second stage of the pair may be smaller than the comparable currents in the first stage of the pair, the current ratio of the two stages of one or each such pair being preferably approximately 2:1, again to assist in reducing power consumption.

Advantageously, in each of the second to nth stages of the converter, where $2 \leqq n \leqq N$, each of the respective storage capacitors of the said first and second voltage storage circuits of the stage has a capacitance that is reduced, relative to the capacitance of the comparable storage capacitor of the immediately-preceding stage, by a first scaling factor that is constant throughout those second to nth stages. Scaling the capacitance by a constant scaling factor in this way helps to reduce power consumption of the converter and to reduce the amount of chip area required to make the converter.

The said first scaling factor is preferably 2. This value of scaling factor is optimal in terms of reduced power consumption.

Advantageously, in each of the second to nth stages of the converter, where $2 \leqq n \leqq N$, the amplifier element input device of each voltage storage circuit of the stage is of a channel width that is reduced, relative to the channel width of the comparable amplifier element input device of the immediately-preceding stage, by a second scaling factor that is constant throughout those second to nth stages.

Such scaling by a constant factor for a number of successive stages can also contribute to reducing the power consumption of the converter and the chip area occupied thereby.

The said second scaling factor is preferably also 2. This results in optimal power consumption reduction.

Advantageously also, in each of the second to nth stages of the converter, where $2 \leqq n \leqq N$, the current in each of the said controllable current paths of the amplifier element input devices of the stage is controlled to be reduced, relative to the current in the comparable controllable current path of the immediately-preceding stage, by a third scaling factor that is constant throughout those second to nth stages.

Such scaling can further contribute to a reduction in the power consumption of the converter.

The said third scaling factor is preferably also 2. This value is optimal in terms of power consumption reduction.

In another preferred embodiment, for at least one pair of adjacent stages of the series, at least one of the said preset possible values of the offset voltage in the second stage of the pair is adjusted fractionally as compared with the corresponding preset possible value of the offset voltage in the first stage of the pair.

Such a fractional adjustment can be used to correct for gain errors in the amplifier elements used in each stage, and hence can maintain high-precision operation of the overall converter despite imperfections in those amplifier elements.

Alternatively, or in addition, the said data processing means may be operable to fractionally adjust the digital data provided by the respective comparator means of successive stages of the series so as to facilitate correction of voltage conversion errors in those successive stage.

Another advantageous analogue-to-digital converter comprises:

first and second stages, each being a voltage conversion stage as described above, connected together such that the said first and second output nodes of the fist stage are connected to the said first and second input nodes respectively of the second stage and the said first and second output nodes of the said second stage are connected to the said first and second input nodes respectively of the first such stage, an analogue voltage to be digitised being applied, at the start of an iterative conversion operation of the converter, between the said first and second input nodes of the said first stage;

control means operable to cause the switching means of the first and second stages to be switched alternately, starting with the first stage, from the said input configuration to the said output configuration, such switching being controlled to occur in one stage at a time when the switching means of the other stage are in the output configuration so that prior to such switching the one stage being switched receives as its input voltage the analogue conversion voltage produced by the other stage and so produces its analogue conversion voltage in dependence thereupon after such switching; and data processing means connected for receiving the said digital data provided alternately by the first and stages during the course of the said iterative conversion operation and operative to derive therefrom a digital output word representative of the applied analogue voltage.

In such an analogue-to-digital converter only two stages are required to perform a conversion operation, resulting in a desirably compact and simple design According to a second aspect of the present invention there is provided an analogue-to-digital converter, operable alternately in first and second clock phases, including:

first and second input nodes between which an analogue input voltage to be digitised can be applied when the converter is in use;

first and second voltage storage circuits, each including respective first and second storage capacitors and a unity-gain amplifier element having respective input and output terminals, which element includes an electronic input device having a controllable current path provided between respective first and second current-path electrodes of the device and also having a control electrode to which a potential is applied to control the magnitude of current in the said current path, the said control electrode being connected to the said input terminal of the amplifier element, and the said first and second current-path electrodes being connected with potential tracking means such that both the first current-path electrode potential and the second current-path electrode potential track the control electrode potential, whilst current flows in the said controllable current path, so that the respective potentials of the first and second current-path electrodes are kept substantially fixed in relation to the potential of the said input terminal;

input sampling means operable during an initial one of the clock phases to connect the said input terminal of the first voltage storage circuit to the said first input node and to connect the said input terminal of the second voltage storage circuit to the said second input node;

first and second output nodes connected respectively with the amplifier element output terminals of the said first and second voltage storage circuits;

comparator means connected to the said first and second output nodes and also connected for receiving a comparison potential and operable in each clock phase to perform a comparison between the potential difference between the first and second output nodes and the said comparison potential and to provide digital data indicative of the result of the comparison;

voltage adjustment means having a pair of connection terminals and operable in each clock phase to apply between those terminals an offset voltage having a value selected, by the said digital data provided by the said comparator means in the immediately-preceding clock phase, from a plurality of preset possible values;

switching means operable in the first clock phase to connect the two first storage capacitors and the said connection terminals in series between the respective input terminals of the amplifier elements, whilst connecting the said second storage capacitors in parallel with one another between the first and second output nodes, and operable in the second clock phase to connect the two second storage capacitors and the said connection terminals in series between the respective input terminals of the amplifier elements, whilst connecting the said first storage capacitors in parallel with one another between the first and second output nodes; and data processing means connected for receiving the said digital data provided by the said comparator means over a predetermined number of the said clock phases and operative to derive therefrom a digital output word representative of the applied analogue input voltage.

Such an analogue-to-digital converter requires only one stage to perform a conversion operation, resulting in an especially compact design.

According to a third aspect of the present invention there is provided an analog-to-digital converter including a plurality of mutually-similar voltage conversion stages connected in series so that the output of one stage provides an input to the next stage, each stage including a storage capacitor selectively connectible to the input of the stage for storing an input voltage of the stage and also including an amplifier element selectively connectible between the storage capacitor and the output of the stage for delivering an output voltage of the stage which is dependent on the stored input voltage, wherein in at least one stage, other than the first stage, of the series the storage capacitor capacitance is smaller than the storage capacitor capacitance of the immediately-preceding stage and/or the width of an input transistor of the amplifier element is smaller than the width of the input transistor of the amplifier element of the immediately-preceding stage.

Such an analogue-to-digital converter, employing a series of "scaled" voltage conversion stages, can achieve an improved overall noise/power consumption tradeoff. The factor (scaling factor) by which the storage capacitor capacitance and/or input transistor width is scaled from one stage to the next is preferably close to 2. Scaling may be stopped after the first few stages, for example the first six stages may be scaled one from the next and then the remaining stages can be constant size.

BRIEF DESCRIPTION OF THE DRAWINGS

FIG. 14 is a schematic diagram of parts of the converter of FIG. 12, for illustrating advantages of scaling the stages in the FIG. 12 converter one from the next by a scaling factor;

FIG. 16 is a schematic diagram illustrating one example of the layout of the FIG. 12 converter on a chip.

DETAILED DESCRIPTION OF THE PREFERRED EMBODIMENTS

Figure 3:
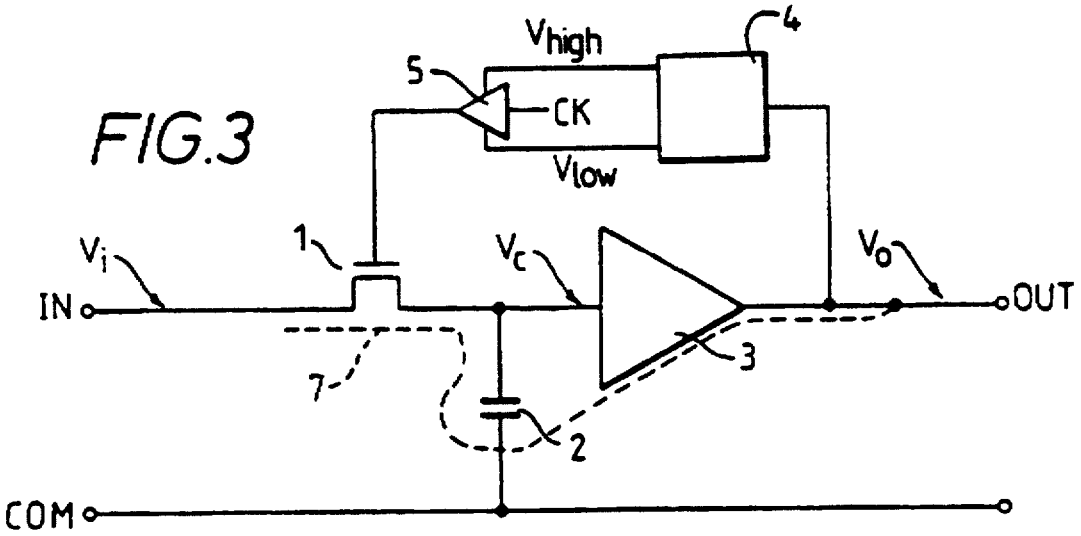
FIG. 3 shows a circuit diagram of a voltage storage circuit embodying the aforesaid first aspect of the present invention.

The voltage storage circuit of FIG. 3 includes an electronic switch element 1, preferably an MOSFET transistor, a storage capacitor 2, a unity-gain buffer 3, and a bootstrapped switch driving device 4,5 connected between an output terminal circuit and the gate electrode (control electrode) of the MOSFET 1.

Figure 4:
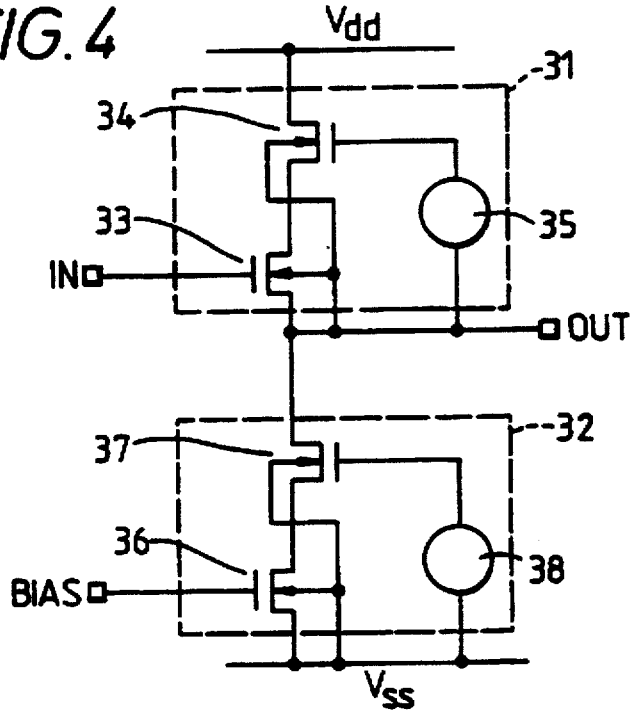
FIG. 4 shows one design of an amplifier element included in the FIG. 3 circuit.

FIG. 4 shows a first example of the construction of the amplifier element 3 in the FIG. 3 circuit. The element 3 comprises two basic portions, namely a cascoded source follower 31 and a current source 32.

The cascoded source follower 31 comprises an n-channel MOSFET input transistor 33 whose gate electrode is connected to one plate (the upper plate in FIG. 3) of the storage capacitor 2. The drain-source channel of the input transistor 33 is connected in series with the drain-source channel of a further n-channel MOSFET transistor, which will be referred to hereinafter as a cascoding transistor 34. The drain electrode of the cascoding transistor 34 is connected to a positive supply line $V_{dd}$ of the circuit, whilst the source electrode of the input transistor 33 is connected to an output terminal OUT of the circuit.

Also in the cascoded source follower 31, a bias generator 35 is connected between the source electrode of the input transistor 33 and the gate electrode of the coding transistor 34. This bias generator serves to maintain a substantially constant potential difference between the gate electrode of the cascode transistor and the source electrode of the input transistor 33, irrespective of variation of the source electrode potential.

The current source 32 is constituted substantially identically to the cascoded source follower 31 and comprises two n-channel MOSFET transistors 36 and 37 (corresponding respectively to the transistors 33 and 34 of the cascoded source follower 31), connected in series between the output terminal OUT of the circuit and a negative supply line $V_{ss}$ of the circuit, an associated bias generator 38 (corresponding to the bias generator 35 in the cascoded source follower 31) which serves to maintain a substantially constant potential difference between the gate electrode of the transistor 37 and the source electrode of the transistor 36. In this case, the source electrode of the transistor 36 is connected directly to the negative supply line $V_{ss}$, so that the gate electrode potential of the transistor 37 is fixed in relation to the negative supply line. The current source 32 has a bias input BIAS connected to the gate electrode of the transistor 36. A bias potential can be applied to the bias input of the current source 32 for controlling operation of the element, as will be described hereinafter.

Since the current source 32 is connected in series with the cascoded source follower 31, it serves to complete a current path between the positive and negative supply lines $V_{dd}$ and $V_{ss}$.

In operation of the amplifier element of FIG. 4, the current source is operable to cause a substantially constant current to pass through the above-mentioned current path and hence through each of the transistors 33 and 34 of the cascoded source follower 31. This causes the source electrode potential of the input transistor 33 to track the gate electrode potential thereof such that the output terminal potential $V_o$ follows the potential $V_c$ of the upper plate of the storage capacitor 2. Thus, the voltage gain of the element is substantially unity.

Similarly, the source electrode potential of the cascoding transistor 34 is caused to track the gate electrode potential thereof, which potential is in turn maintained substantially fixed in relation to the source electrode potential of the input transistor 33 by the bias generator 35. Accordingly, the drain electrode potential of the input transistor 33 tracks the source electrode potential thereof and hence also tracks the potential $V_c$ of the upper plate of the storage capacitor 2.

As will be apparent, irrespective of the upper plate potential $V_c$ of the storage capacitor 2, the source and drain electrode potentials of the input transistor 33 are each substantially fixed in relation to one another and to the gate electrode potential of that input transistor. Thus, the gate-source, gate-drain and drain-source parasitic capacitances $C_{gs}$, $C_{gd}$, $C_{ds}$ are not charged or discharged as the upper plate potential $V_c$ of the storage capacitor 2 varies, and thus these parasitic capacitances have substantially no effect on the voltage stored in the storage capacitor 2.

Because the input transistor 3 is an FET input transistor, the gate current is substantially zero, so that the charge stored in the storage capacitor is not diminished significantly by operation of the amplifier element 3 after the input switch element 1 has been opened.

In the FIG. 4 amplifier element, the actual output terminal potential is not exactly equal to the upper plate potential $V_c$, but is reduced slightly in accordance with the ON gate-source differential voltage of the transistor 33, as follows:

$$V_O=V_c-(V_T+V_{DSAT})$$

where $V_T$ is the threshold voltage of the input transistor 33 and $V_{DSAT}$ is the saturation voltage of the input transistor 33.

As will be apparent from FIG. 4, the cascoded source follower 31 and the current source 32 are constructed substantially identically to one another. Thus, the counterpart of the input transistor 33 of the cascaded source follower 31 is the transistor 36 in the current source 32, to which transistor 36 the above-mentioned bias potential is applied. Because the same current flows through the respective drain-source channels of the transistors 33 and 36, and these transistors are of identical dimensions, the gate-source potential of the transistor 33 can be controlled by adjusting the gate-source potential of the transistor 36 in the current source 32. This gate-source potential of the transistor 36 is equal to the difference between the bias potential and the negative supply line potential so that by applying a suitable constant bias potential to the bias terminal the difference between the output terminal potential $V_o$ and the upper plate potential $V_c$ of the storage capacitor 2 can be set to a desirably small constant level.

In the FIG. 4 amplifier element, the transistors 33, 34, 36 and 37 can be of the depletion or enhancement type.

Figure 5:
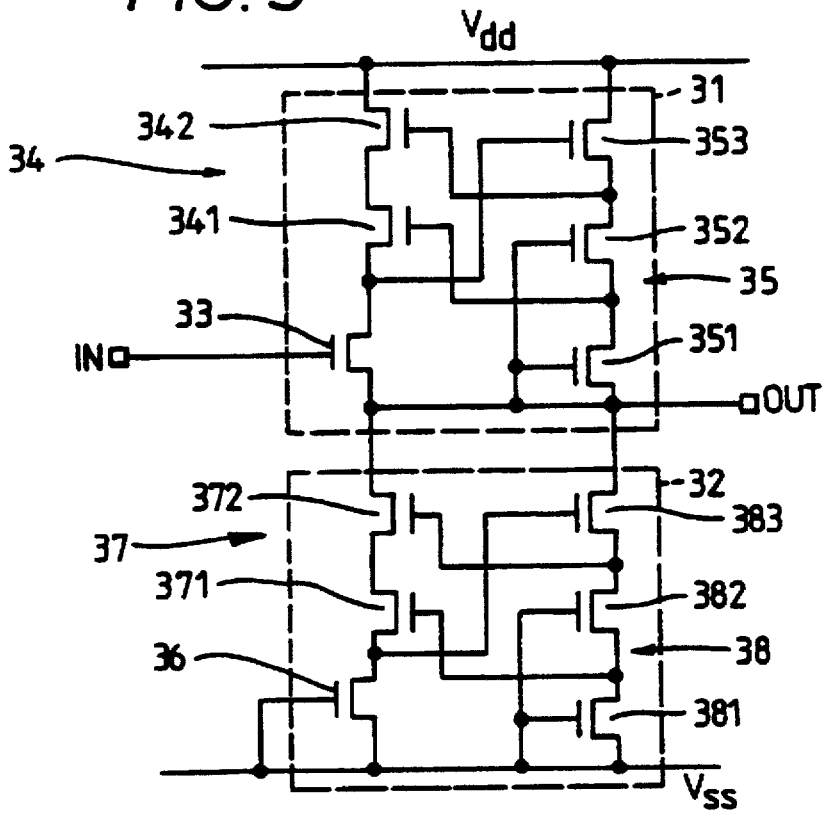
FIG. 5 shows another design of amplifier element for use in the FIG. 3 circuit.

FIG. 5 shows a more sophisticated example of the construction of the amplifier element 3, employing depletion-type n-channel MOSFET transistors to provide high speed operation. In the FIG. 5 example, the amplifier element again comprises a cascoded source follower 31 and a current source 32, and the FET input transistor 33 in the cascoded source follower 31 is again connected in the cascoded source follower configuration previously described with reference to FIG. 4, the gate electrode of the transistor 33 being connected to receive the upper plate potential $V_c$ of the storage capacitor 2, the source electrode of the transistor 33 being connected to the output terminal OUT of the circuit and the drain electrode of the transistor 33 being connected by way of first and second cascoding transistors 341 and 342 to the positive supply line $V_{dd}$ of the circuit.

In this case, the cascode bias generator 35 comprises three series-connected transistors 351, 352 and 353 connected for applying suitable bias potentials to the respective gate electrodes of the first and second cascoding transistors 341 and 342, so that the respective gate electrodes of the cascading transistors 341 and 342 are each maintained at potentials substantially fixed in relation to the source electrode potential of the input transistor 33.

The current source 32 of the FIG. 5 amplifier element is constituted identically to the cascoded source follower 31 thereof and includes, connected between the source electrode of the input transistor [31] *33* and the negative supply line $V_{ss}$, three series-connected transistors 36, 371 and 372 (corresponding respectively to the transistors 33, 341 and 342 of the cascoded source follower 31). In this case the gate electrode potential of the transistor 36 (equivalent to the bias potential applied to the bias input in the FIG. 4 amplifier element) is provided by the negative supply line $V_{ss}$, while the respective gate electrode potentials of the transistors 371 and 372 are provided by a bias generator 38 (constructed identically to the bias generator 35 in the cascoded source generator 31) comprising three series-connected transistors 381 to 383. It will be seen that the bias generators 35 and 38 are connected in series with one another between the positive and negative supply lines so as to complete a further current path therebetween.

In the FIG. 5 amplifier element, because the gate electrode of the transistor 36 in the current source 32 is connected directly to the negative supply line $V_{ss}$, the gate and source potentials of the transistor 36 are equal to one another. Since the same drain-source current flows through the input transistor 33 as through its counterpart transistor 36 in the current source 32, and the cascoded source follower 31 and the current source 32 are of substantially identical construction, it follows that the gate and source potentials of the input transistor 33 in the cascoded source follower 31 will also be substantially equal to one another in potential. Thus, the voltage gain of the FIG. 5 amplifier element is closer to unity (approximately 0.9995) than is the case with the FIG. 4 amplifier element. As compared with the FIG. 4 amplifier, the FIG. S amplifier element is also capable of fast operation. In other respects, however, the operation of the FIG. 5 element is substantially identical to that of the FIG. 4 amplifier element.

Returning now to FIG. 3, the bootstrapped switch driving device comprises potential generating circuitry 4 having an input connected to the output terminal of the circuit and operable to provide at respective outputs thereof potentials $V_{high}$ and $V_{low}$ ($V_{high}>V_{low}$) each of which has a constant offset from the output terminal potential. These two potentials must be at suitable levels to apply to the gate electrode of the MOSFET 1 in order to maintain it in its ON and OFF conditions.

The two potentials $V_{high}$ and $V_{low}$ are applied as inputs to a selector element 5 which also receives a switching signal CK. The output of the selector circuit 5 is connected to the gate electrode of the MOSFET switch element 1 for controlling the potential thereof. The selector element 5 switches the gate electrode potential between the two potentials $V_{high}$ and $V_{low}$ in dependence upon the switching signal CK. This signal CK may be a logic signal provided by digital logic circuitry controlling operation of the voltage storage circuit.

In order to avoid unpredictable charge injection by the MOSFET input switch element 1 into the storage capacitor 2 when the input switch element is turned OFF, the control potential applied to the gate electrode of the MOSFET must be substantially fixed in relation to the input terminal potential at least when the MOSFET is to be ON, as will now be explained with reference to FIG. 6.

Figure 6:
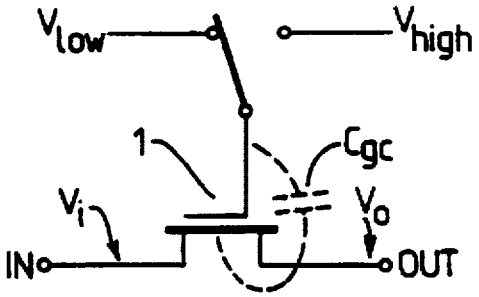
FIG. 6 shows in more detail an input witch element included in the FIG. 3 circuit.

FIG. 6 shows the input switch element 1, in this example an n-channel enhancement type MOSFET, in detail. The MOSFET 1 has a source electrode providing an input terminal IN of the switch element, a drain electrode providing an output terminal OUT of the switch element, and a gate electrode connected to be switched alternatively between the two above-mentioned control potentials $V_{high}$ and $V_{low}$. The drain-source channel of the transistor is non-conducting when the gate-channel potential thereof is zero (or negative) so that when the applied control potential is $V_{low}$ ($\leqq V_o$) the output terminal of the switch element is isolated from the input terminal thereof, the off-resistance ($R_{off}$) of the switch element in this condition being typically more than 10,000 MΩ. When the gate potential is changed to $V_{high}$ ($>V_o$) the drain-source channel is brought into conduction, the on-resistance ($R_{on}$) of the switch element in this condition being of the order of 10s or 100s of ohms.

In an analog-to-digital converter employing a voltage storage circuit such as that shown in FIG. 3 the operation of the switch element 1 is normally required to be controlled by digital logic circuitry of the converter and, partly for this reason, in prior proposals fixed digital logic potentials (for example 0 and $+V_{DD}$ volts) were conventionally applied to the gate to control the switching of the element.

However, a problem arises when such digital logic potentials are used as will now be explained.

The MOSFET switch element 1 of FIG. 6 unavoidably has a parasitic gate-channel capacitance $C_{gc}$ between its gate electrode and its drain-source channel. This parasitic capacitance has a first component due to physical overlap between the gate and the channel of the FET, and a second component associated with charge stored in the channel when the FET is in the ON condition. It is found that this second component vanes with the channel potential (i.e. with the potential $V_i$ of the signal being switched) but in an unpredictable manner.

The gate-channel capacitance gives rise to charge injection from the gate to the channel at the moment of switching $t_{switch}$, which in tan gives rise to an error in the stored voltage. Charge injection due to the above-mentioned first component of the gate-channel capacitance depends essentially on the change in gate voltage $\Delta V_G$ at $t_{switch}$ (eg. $O-V_{DD}=-V_{DD}$) and so is substantially independent of the channel potential $V_i$ at $t_{switch}$. Charge injection due to the second component of the gate-channel capacitance is, however, influenced by the input signal potential $V_i$ relative to the gate potential at the moment of switching, leading to the above-mentioned error in the stored voltage and for non-linearity in the operation of the voltage storage circuit It is not readily practical to compensate for such charge injection, for example by coupling an inverted version of the gate signal through a mall adjustable capacitor, because the effect of the above-mentioned second component of the gate-channel capacitance is not sufficiently predictable.

The effects of charge injection at the moment of switching $t_{switch}$ prior proposals employing fixed control potentials, such as digital logic potentials, are particularly significant in the case where it is desired to employ a storage capacitor having a small capacitance to reduce the acquisition time of the circuit.

In the bootstrapped switch driving device 4, 5 of FIG. 3, however, at least the control potential applied to the switch element 1 to maintain it in the ON condition is fixed relative to the input terminal potential $V_i$ so that the amount of charge injected by the element 1 when it is switched OFF is substantially constant irrespective of the input terminal potential. Because this charge injection is constant, it leads to a constant error in the stored voltage, which can be readily compensated for.

Incidentally, in some cases it may be possible for the control potential applied to the switch element 1 when it is to be maintained in the OFF (as opposed to the ON) condition to be fixed, rather than variable with the input potential $V_i$ as in FIG. 3. This is because the above-mentioned first component of the gate-channel parasitic capacitance $C_{gc}$ is linear.

The potentials $V_{high}$ and $V_{low}$ required depend on the type and threshold voltage of the MOSFET used in the MOSFET 1. This switch element can be of the enhancement or depletion type and can be of n-channel or p-channel. For an n-type channel MOSFET, $V_{high}$ will be applied to the gate electrode to turn ON the MOSFET (i.e. $V_{high}$ is the ON potential and $V_{low}$ will be applied to turn it OFF (i.e. $V_{low}$ is the OFF potential, whereas for a p-channel MOSFET $V_{high}$ will be applied to the gate electrode to turn OFF the MOSFET (i.e. $V_{high}$ is the OFF potential) and $V_{low}$ will be applied to turn it ON (i.e. $V_{high}$ is the ON potential).

In the case of an n-channel MOSFET having a threshold voltage $V_T$, for low on-resistance $$V_{high}-V_i \geqq V_T+V_{on}$$

where $V_{on}$ is a predetermined potential difference. Similarly, for high off-resistance $$V_{low}-V_i<V_T-V_{off},$$

where $V_{off}$ is also a predetermined potential difference.

The difference between the ON and OFF potentials is thus $V_{on}+V_{off}$, which must be at least several hundred mV.

It may be possible to use the output terminal potential $V_o$ directly to provide one of the two potentials $V_{high}$ and $V_{low}$.

For example, in the case in which the MOSFET switch element 1 is an n-channel depletion type switch element $V_{high}$ can simply be $V_o$; likewise, in the case in which the MOSFET switch element 1 is an n-channel cement type switch element, $V_{low}$ can be the output terminal potential $V_o$.

In the FIG. 3 voltage storage circuit, the potential generating circuitry 4 is shown interposed between the output terminal and the selector circuit 5. However, this circuitry 4 may in some cases be omitted if the required potentials $V_{high}$ and $V_{low}$ are already available on existing internal biasing lines of the circuit, in particular on internal biasing lines of the amplifier element 3. Alternatively, as will be described later in more detail with reference to FIG. [9] *7*, the required potentials $V_{high}$ and $V_{low}$ may be derived from internal biassing line potentials that are not directly suitable for [proving] *providing* the potentials $V_{high}$ and $V_{low}$.

It will be apparent that in the above-described examples of suitable constructions of the amplifier element 3, the amplifier element has bias generators 35 and 38 which provide gate electrode bias voltages on internal biasing lines of the element. These bias voltages track the output terminal potential.

The potential levels of these internal biasing lines may be suitable for directly providing the required ON and OFF potentials for use in controlling switching of the switch element 1, in which case the potential generating circuitry 4 in the FIG. 3 circuit can of course be omitted entirely.

In other cases, the amplifier element may well have a pair of internal biasing lines the potential difference between which is greater than or equal to the difference $(V_{on}+V_{off})$ between the required ON and OFF potentials. However, the respective potential levels of the internal biasing lines of the pair may not always be suitable for providing the ON and OFF potentials directly. Alternatively, one of the required ON and OFF potentials, for example the ON potential in the case of enhancement type MOSFET switch element or the OFF potential in the case of a depletion type MOSFET switch element, may on some occasions need to be outside the supply lines of the circuitry.

These difficulties may be overcome by adopting a circuit construction for the amplifier element 3 and switch driving device 4, 5 as described below with reference to FIG. 7.

Figure 7:
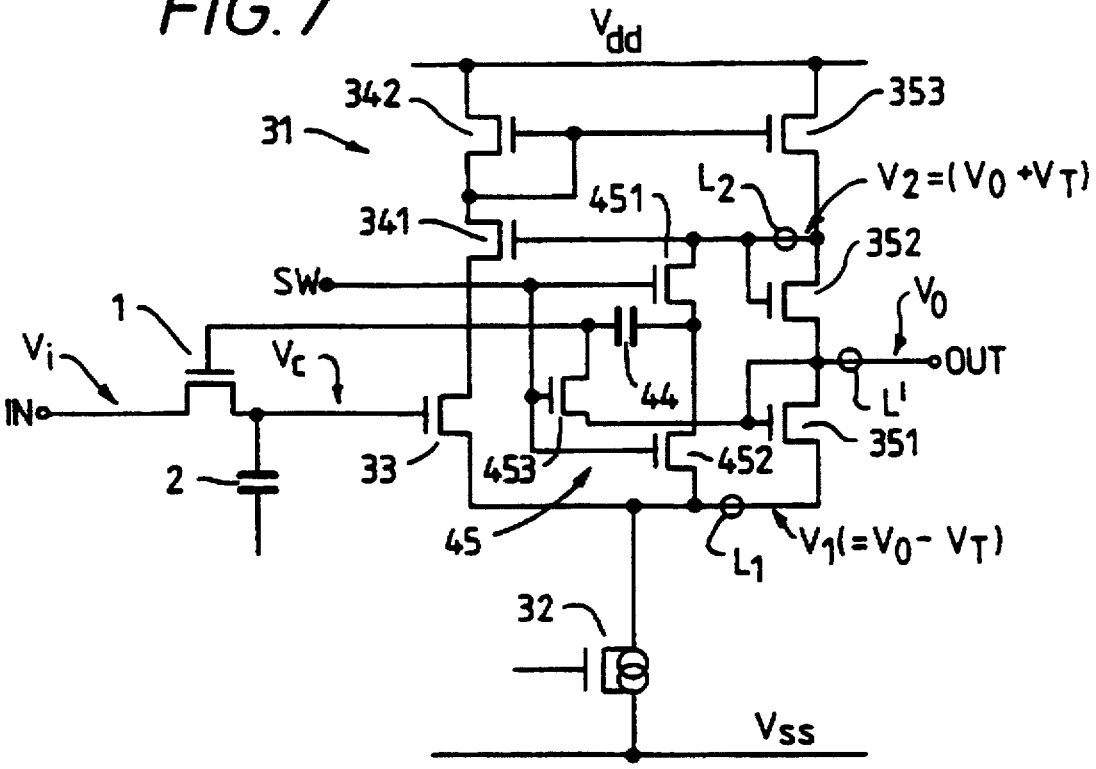
FIG. 7 shows yet another design of amplifier element, together with an example of switch driving means, for use in the FIG. 3 circuit.

In FIG. 7, the amplifier element 3 is made up mainly of enhancement type n-channel MOSFET transistors but is otherwise constructed in a similar manner to the examples shown in FIGS. 4 and 5, and comprises a cascoded source follower 31 and a current source 32 connected in series between the positive supply line $V_{dd}$ and the negative supply line $V_{ss}$. As before, the cascoded source follower 31 includes an input transistor 33 and a cascoding transistor 341, plus a further transistor 342, connected between the positive supply line $V_{dd}$ and the drain electrode of the transistor [331] *341*, and a cascode bias generator 35 comprising transistors 351 and 352 connected in series, together with an additional transistor 353, between the positive supply line $V_{dd}$ and the source electrode of the transistor 33. In this case, the output terminal OUT of the circuit is connected to the drain electrode of the transistor 351 which, when the amplifier element is in use, is maintained at substantially the same potential as the gate electrode of the transistor 33, i.e. at the voltage $V_c$ of the upper plate of the storage capacitor 2 connected to the gate electrode. In this respect, the transistors 342 and 353 are selected and connected so as to constitute a PMOS current mirror which serves to decrease the amplifier gain error by ensuring that the current in transistor 351 is the same as that in the input transistor 33, so that the output voltage closely follows the input voltage. It should be noted, however, that such use of a PMOS current mirror is optional.

The amplifier element 3 of FIG. 7 has a first internal biasing line L1 which is connected to the source electrode of the transistor 31. When the circuit is in use, this internal biasing line will be maintained at a potential $V_1$ which is lower than the capacitor voltage $V_c$ by an amount equal to the threshold voltage $V_T$ of the transistor 31, i.e. $V_1=V_c-V_T$.

The amplifier element 3 has a further biasing line L' connected to the drain of the transistor 351 of the cascode bias generator, which biasing line (as noted above) is maintained at substantially the capacitor voltage $V_c$ when the circuit is in use, but the potential difference between the internal biasing lines L1 and L' is only $V_T$ which is less than the above-mentioned potential difference $(V_{on}+V_{off})$ between the ON and OFF potentials required for controlling the switch element 1. However, the transistor 352 included between the transistors 351 and [352] *353* in the cascode bias generator 35 operates to generate, at a second biasing line L2 of the element, a potential $V_2$ which is always greater than the output terminal potential $V_o$ by an amount substantially equal to the threshold voltage $V_T$ of the transistor 352. The potential difference between the first and second biasing lines L1 and L2 is substantially equal to two transistor threshold voltages $2V_T$, which potential difference is greater than or equal to the required difference $(V_{on}+V_{off})$ between the ON and OFF potentials of the switch element 1.

An example of switch driving device 4, 5 capable of employing these potentials $V_1$ and $V_2$ to generate the required ON and OFF potentials will now be given. In this example the switch element 1 is of the n-channel enhancement type so that the OFF potential, $V_{low}$, can be the output terminal potential $V_o$ itself, and the ON potential is $V_{high}\approx V_{low}+2V_T$. This ON potential can be greater than the positive supply line $V_{dd}$ in this example.

In FIG. 7, the potential generating element 4 includes a bootstrap capacitor 44 and connecting element 45, comprising transistors 451 to 453, connected for providing controllable connections between the plates of the bootstrap capacitor 44 and the internal biasing lines L1 and L2 and the output terminal OUT.

The transistors 451 to 453 of the connecting means 45 each receive a logic signal SW which is at the high logic level when the switch element 1 is to be OFF and at the low logic level when the switch element 1 is to be ON.

The logic signal SW is derived from the switching signal CK used to control the switch element 1, so that it can be changed from the high logic level to the low logic level in response to the switching signal CK.

The transistor 451 is a p-type transistor which is therefore turned ON when the logic signal SW is at the low logic level, whereas the transistors 452 and 453 are n-type transistors which are therefore turned ON only when the logic signal SW is at the high logic level.

The p-type transistor 451 is connected between the second biasing line L2 and the negative plate of the bootstrap capacitor 44, the n-type transistor 452 is connected between that plate and the first biasing line L1, and the n-type transistor 453 is connected between the positive plate of the bootstrap capacitor 44 and the output terminal OUT.

The positive plate of the bootstrap capacitor 44 is permanently connected to the gate electrode of the switch element 1.

Operation of switch driving device 4, 5 of FIG. 7 is as follows. When the logic signal SW is at the high logic level to cause the switch element to be in the OFF condition the n-type transistors 452 and 453 are turned ON so that the positive plate of the bootstrap capacitor 44 and the gate electrode of the switch element 1 are maintained at the output terminal $V_o$ ($=V_{low}$) potential while the negative plate of the capacitor 44 is maintained at the potential $V_1$ ($=V_o-V_T$) of the first biasing line L1. Thus the bootstrap capacitor is charged to a potential substantially equal to $V_T$.

If the logic signal SW is now changed, in response to the switching signal CK, from the high logic level to the low logic level to turn the switch element ON, both of the n-type transistors 452 and 453 are turned OFF, and the p-type transistor 451 is turned ON. Thus, the negative plate of the bootstrap capacitor 44 undergoes a change in potential from $V_1$ to $V_2$ at a time when its positive plate is isolated from the output terminal potential $V_o$. As a result, the positive plate potential is free to float in accordance with the change ($V_2-V_1\approx 2V_T$) in the negative plate potential, and so the positive plate potential changes by $V_2-V_1$. As a result the gate electrode potential of the switch element 1 changes from the output terrors potential $V_o$ ($=V_{low}$) to $V_o+2V_T$ ($=V_{high}$), even if $V_o+2V_T>V_{dd}$.

It should be noted that the capacitance of the bootstrap capacitor 44 should be large compared to the gate capacitance of the switch element 1 in order that the magnitude of the change in the potential at the positive plate of the bootstrap capacitor 44 at the moment of switching is not diminished unduly as compared with the corresponding change in the potential at the negative plate thereof.

As described above, the use of a bootstrap capacitor and appropriate connecting means, actuable in dependence upon the switching signal CK used to control switching, can enable the required ON and OFF potentials to be derived from the potentials of internal biasing lines of the circuit even when those lines do not have potentials that are suitable for providing those ON and OFF potentials directly. The bootstrap capacitor 44 can also permit these ON and OFF potentials to be outside the supply lines of the circuit. Moreover, the use of internal biasing lines which are necessarily already present in the circuit in the generation of the ON and OFF potentials can result in a worthwhile saving in the amount of circuitry required.

Preferably, the voltage storage circuit of FIG. 3 is constructed as an integrated circuit in order to make it possible to bootstrap the parasitic capacitances in the circuit, including the capacitance of the switch element 1, the input capacitance of the amplifier element 3 and any interconnect capacitance.

To this end, the switch element 1, storage capacitance 2, and parts of the amplifier element 3 of the FIG. 3 circuit are advantageously formed in a well (denoted at 7 of FIG. 3) of opposite conductivity type to that of the surrounding material of the substrate. For example, if the integrated circuit is of the CMOS type having an n-substrate, the well 7 in which the switch element 1, storage capacitor 2 and buffer element 3 are formed will be of the p-conductivity type. The well is then connected so that its potential is substantially fixed in relation to the upper plate potential $V_c$ of the storage capacitor 2. For example the well may be connected electrically to the output terminal of the circuit, as shown in FIG. 3.

Figure 8A:
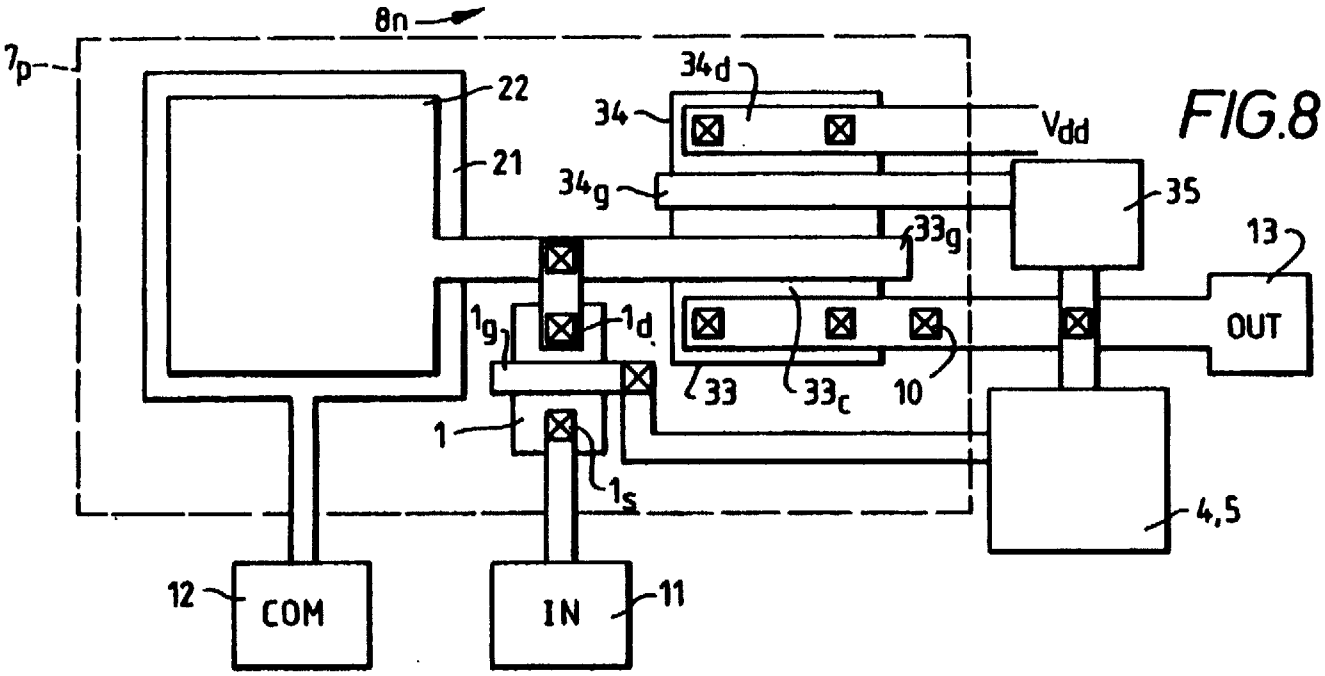
FIGS. 8(A) and 8(B) show respective plan and cross-sectional views illustrating one possible layout of the circuit of FIG. 3 on an integrated circuit substrate.
Figure 8B:
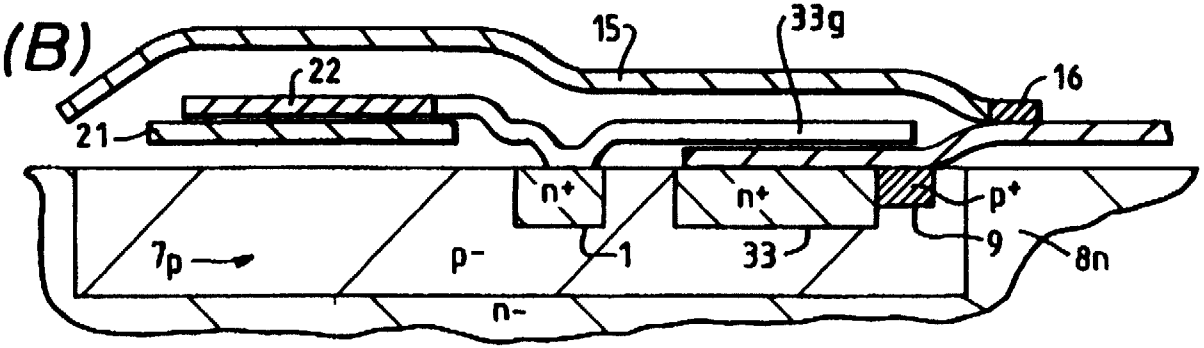

FIGS. 8(A)–(B) illustrate one possible layout, within such an integrated circuit, of the voltage storage circuit of FIG. 3 when the amplifier element 3 is constituted substantially as shown in FIG. 4. As indicated in FIGS. 8(A)–(B), the switch element 1, storage capacitor 2 and the input transistor 33 and cascoding transistor 34 of the amplifier element 3 are formed within a p-well 7p formed in a n-substrate 8n. The current source 32, current source bias generator [33] *38* (both not shown in FIGS. 8(A)–(B)), the cascode bias generator 35 and switch driving means 4, 5 are formed outside the well 7p. The cascode bias generator 35 and switch driving device 4, 5 may alternatively also be within the well.

As shown in detail in FIGS. 8(A)–(B), the input voltage of the FIG. 3 circuit is applied between an input terminal (IN) 11 and a common terminal (COM) 12 thereof, the common terminal 11 being connected to the lower plate 21 of the storage capacitor 2. The upper plate 22 of the storage capacitor 2 is connected to the gate electrode 33g of the transistor 33 and also to the drain electrode 1d of the switch element 1. The source electrode 1s of the switch element 1 is connected to the input terminal (IN) 11.

The output terminal (OUT) 13 of the circuit is connected to the source electrode 33s of the transistor 33, the transistor 33 being formed to have a common channel 33c with the cascode transistor 34. The drain electrode 34d of the cascoding transistor 34 is connected to the positive supply rail $V_{dd}$ and the gate electrode 34g thereof is connected, by way of the cascode bias generator 35, to the output terminal 13. The switch driving means 4, 5 are connected between the output terminal 13 of the circuit and the gate electrode 1g of the switch element 1.

The p-well 7p is connected electrically to the output terminal 13 by a $p^+$ contact region 9 provided within the p-well 7p at a location therein adjacent to the $n^+$ channel 33c, as shown in FIG. 8(B). A contact 10 serves to connect the contact region 9 to the output terminal 13, as shown in FIG. 8(A). Also, as shown in FIG. 8(B) a shield 15 is optionally provided over the devices within the well, which shield is also connected electrically by contact 16 to the output terminal 13 of the circuit.

It will be appreciated that, since they are formed in a p-well in FIGS. 8(A)–(B), the MOSFET switch element 1, and the transistors 33 and 34 of the amplifier element 3 must be of the n-channel type.

In the case of the amplifier element of FIG. 5, the cascoded source follower 31 (comprising the FET input transistor 33, the cascode transistors 341 and 342 and the transistors 351 to 353 of the cascode bias generator 35) is formed entirely within a P-well of the circuit containing the storage capacitor 2 and switch element 1. As before, the well may, for example, be electrically connected to the output terminal OUT of the circuit. The current source 32 of the FIG. 5 amplifier element will then be formed in a second p-well, which should be connected electrically to a point in the circuit. The potential of which is fixed in relation to the supply lines of the circuit, for example the negative supply line itself.

Figure 9A:
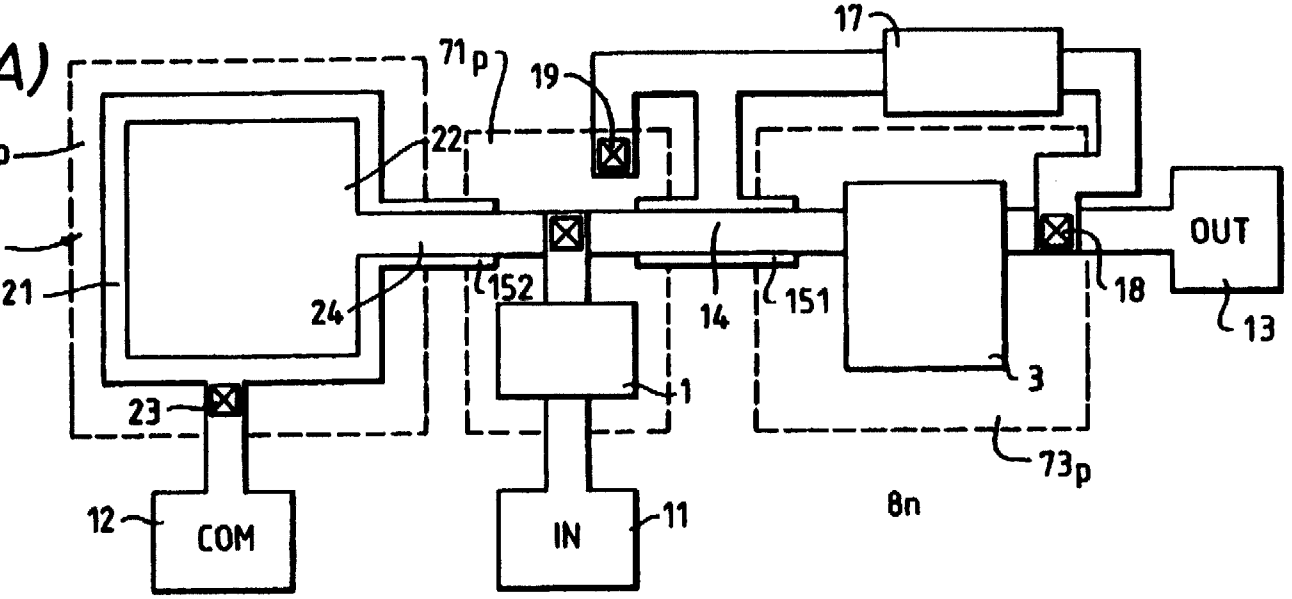
FIGS. 9(A) and 9(B) show respective plan and cross-sectional views illustrating another possible layout of the circuit of FIG. 3 on an integrated circuit substrate.
Figure 9B:
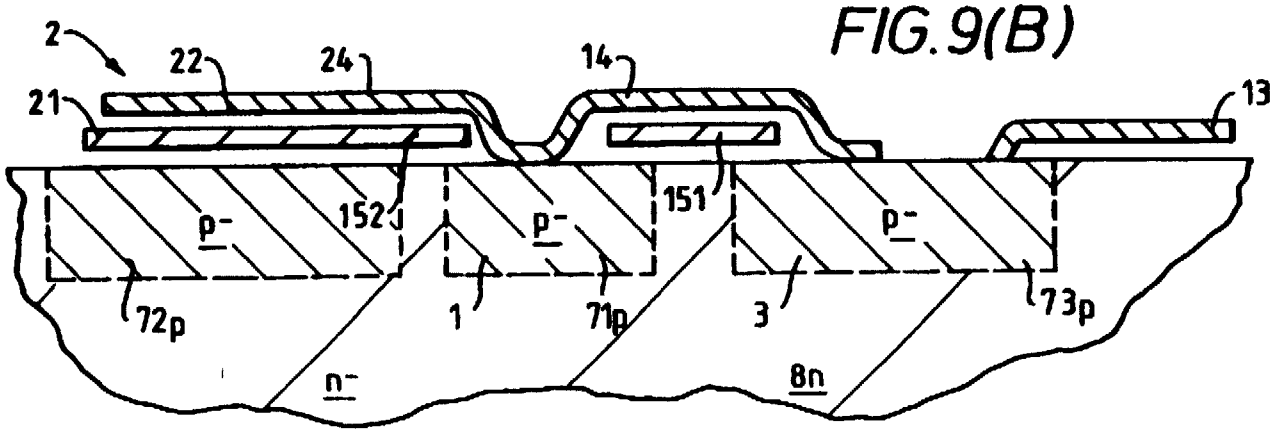

It is not essential in the FIG. 3 circuit for the input switch element 1, the storage capacitor 2 and the amplifier 3 to be formed together in a single well. In FIGS. 9(A)–(B), by way of example, the switch element 1 and the storage capacitor 2 and the amplifier element 3 are formed in different respective p-wells 71p, 72p and 73p.

The swell 71p is connected electrically to the output terminal (OUI) 13 of the cut by way of an auxiliary buffer element 17 and contacts 18 and 19, so as to be at a potential substantially fixed in relation to the output terminal potential and hence in relation to the upper plate potential of the storage capacitor 2.

The p-well 72p is connected electrically to the bottom plate 21 of the storage capacitor by way of contact 23 so as to be at a potential substantially fixed in relation to the upper plate potential when the switch element 1 is in the OFF condition.

The p-well 73p is connected electrically to the output terminal (OUT) 13 of the circuit by contact 18 so that it is also at a potential substantially fixed in relation to the upper plate potential of the storage capacitor 2.

The parts 14, 24 of the interconnection portions between the circuit elements 1, 2 and 3 that are outside the wells 71p, 72p and 73p extend over interconnect shielding portions 151, 152 whose potentials are maintained equal to the well potentials, thereby to eliminate parasitic capacitances associated with the interconnection portions.

The well 72p for the storage capacitor 2 is optional.

A particularly advantageous application of a voltage storage circuit as described hereinbefore with reference to FIGS. 3 to 7 will now be described with reference to FIG. 10.

Figure 10:
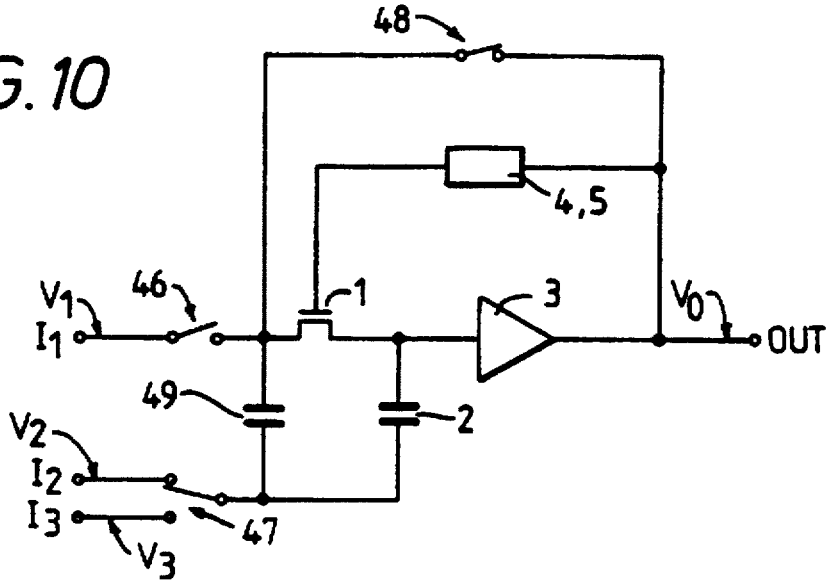
FIG. 10 shows a circuit diagram of voltage summation circuitry employing a voltage storage circuit as shown in FIG. 3.

FIG. 10 shows voltage summation circuitry employing a voltage storage circuit constituted as described hereinbefore with reference to FIG. 3.

The voltage summation circuitry includes, in addition, to the components of the FIG. 3 voltage storage circuit, an input isolation switch element 46 connected in series with the input switch element 1 between that element and a first input node $I_1$, a selection switch element 47 connected between, on the one band, respective second and third input nodes $I_2$ and $I_3$ and, on the other hand, the common terminal COM of the voltage storage circuit, and a feedback switch element 48 connected between the output terminal OUT of the voltage storage circuit and the input side of the input witch element 1.

An auxiliary capacitor 49 may optionally also be provided, connected between the input side of the input switch element 1 and the common terminal COM of the voltage storage circuit, in which case the feedback switch element 48 may be omitted.

In use of the voltage summation circuitry of FIG. 10, initially the switch elements 1 and 46 are both controlled to be ON while the feedback switch element 48 is kept OFF. At this time, the selection switch element 47 is configured to connect the second input node $I_2$ to the common terminal COM of the voltage storage circuit. The input switch element 1 of the voltage circuit is then turned OFF, with the result that the potential difference $V_1-V_2$ between the first and second input nodes $I_1$ and $I_2$ at the moment of switching is stored in the storage capacitor 2 of the voltage storage circuit Thereafter, the input isolating switch element 46 is also turned OFF and the feedback switch element 48 turned ON. As a result, the potential of the input side of the switch element ON is maintained substantially fixed in relation to the potential $V_c$ of the upper plate of the storage capacitor 2 after the input switch element 1 is turned OFF, irrespective of subsequent variations in the first input node potential.

If the auxiliary capacitor 49 is present between the input side of the input switch element 1 and the terminal COM of the voltage storage circuit, this auxiliary capacitor serves alternatively, or in addition, to the feedback switch element 48 to maintain the potential of the input side of the input switch element 1 substantially fixed in relation to the potential $V_c$ of the upper plate of the storage capacitor 2 after the input switch element 1 is turned OFF.

Maintenance of the input side potential after switching OFF of the input switch element 1 is desirable to avoid the possibility of the input switch element 1 being turned ON again if the first input node potential changes sufficiently relative to the OFF potential applied to the gate electrode of the input switch element 1.

At the same time as, or after, the input isolating switch element 46 is turned OFF, the configuration of the selection switch element 47 is changed to connect the third input node $I_3$ to the common terminal COM in place of the second input node $I_2$.

As a result, the output terminal potential becomes substantially equal to the third input node potential $V_3$ plus the stored difference $V_1-V_2$ between the first and second input node potentials, i.e.

$$V_o=V_1-V_2+V_3+V_{error}$$

where $V_{error}$ is an error voltage in the stored potential difference $V_1-V_2$ caused by charge injection by the input switch element 1 at the moment it is turned OFF. When, as discussed hereinbefore, the ON potential applied to the input switch element I tracks the input node potential, this error voltage $V_{error}$ is substantially constant irrespective of the potentials applied to the circuit, so that this error voltage can be compensated for in a desirably simple manner.

It will be appreciated that, by virtue of the effective elimination of parasitic capacitance effects in the voltage storage circuit, the potential of the lower plate of the storage capacitor can be changed freely, after storage of a desired potential difference, without affecting the stored potential difference in an unpredictable manner. This enables a voltage storage circuit constituted as described hereinbefore with reference to FIG. 3 to provide particularly high accuracy in voltage summation applications.

Figure 11:
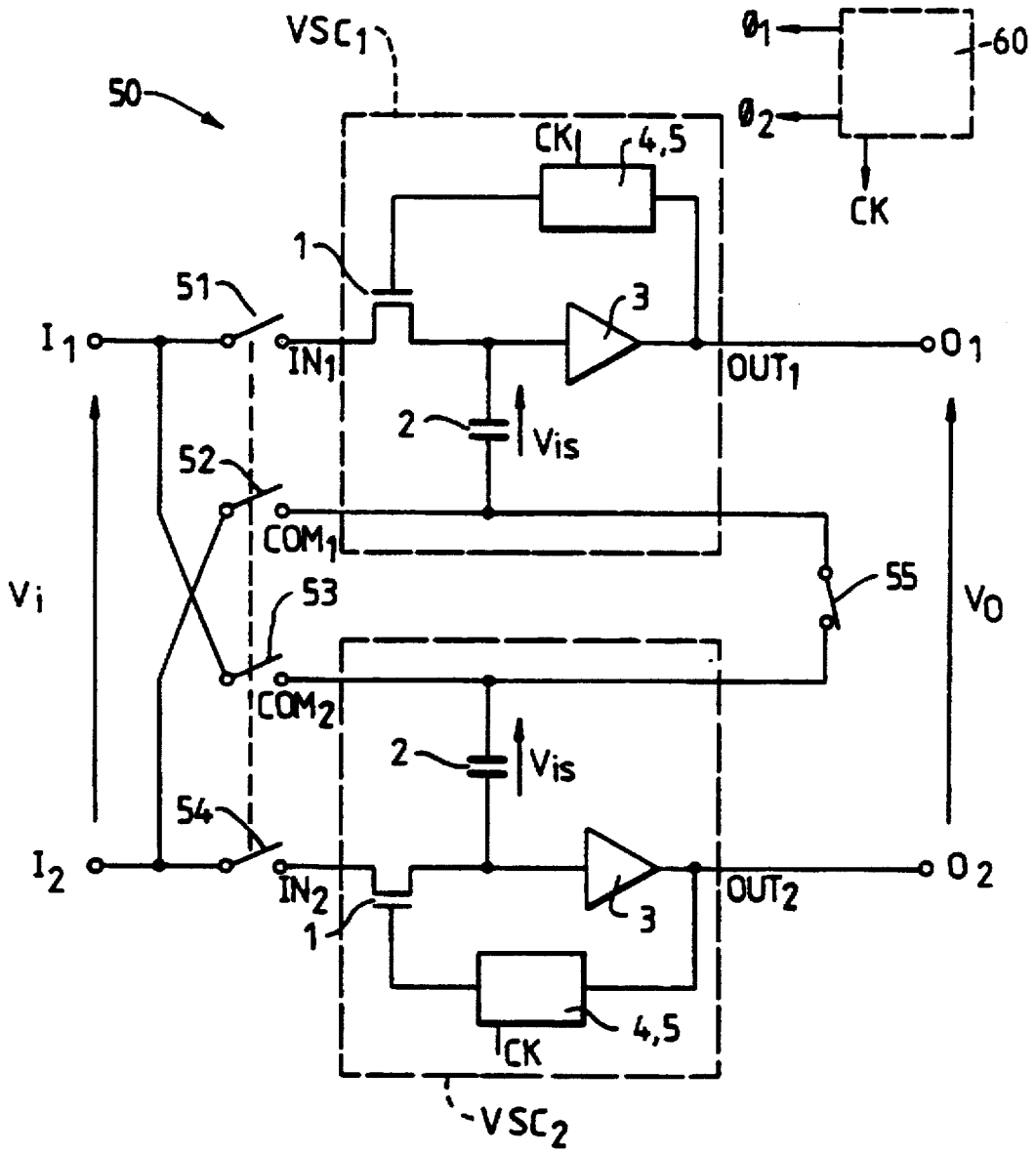
FIG. 11 shows a circuit diagram of voltage doubling circuitry employing two voltage storage circuits as shown in FIG. 3.

As a further advantageous application of the voltage storage circuit of FIG. 3, FIG. 11 shows voltage doubling circuitry 50 including first and second voltage storage circuits $VSC_1$ and $VSC_2$ each constituted as described hereinbefore with reference to FIG. 3.

The circuitry 50 has first and second input nodes $I_1$ and $I_2$ and first and second output nodes $O_1$ and $O_2$. A first controllable switch element 51 is connected between the first input node $I_1$ and input terminal $IN_1$ of the first voltage storage circuit $VSC_1$. A second controllable switch element 52 is connected between the second input node $I_2$ and common terminal $COM_1$ of the first voltage storage circuit $VSC_1$.

A third controllable switch element 53 is connected between the first input node $I_1$ and common terminal $COM_2$ of the second voltage storage circuit $VSC_2$. A fourth controllable switch element 54 is connected between the second input node $I_2$ and input terminal $IN_2$ of the second voltage storage circuit $VSC_2$.

A fifth controllable switch element 55 is connected between the respective common terminals $COM_1$, $COM_2$ of the voltage storage circuits $VSC_1$ and $VSC_2$.

The respective output terminals $OUT_1$ and $OUT_2$ of the first and second voltage storage circuits $VSC_1$ and $VSC_2$ are connected respectively to the first and second output nodes $O_1$ and $O_2$ of the circuitry 50.

The circuitry 50 further comprises control means 60 which apply a first control signal $\phi_1$ to the switch elements 51 to 54 and a second control signal $\phi_2$ to the switch element 55. The control means 60 also apply to the voltage storage circuits $VSC_1$ and $VSC_2$ the above-mentioned switching signal CK used to control switching of the respective switch elements 1 of the voltage storage circuits. The switch elements 51 to 54 are controlled to be in the ON condition when the control signal $\phi_1$ is active, and the switch element 55 is controlled to be in the ON condition when the control signal $\phi_2$ is active. The generation of the switching signal CK applied to the switch driving means 4, 5 of each of the voltage storage circuits is synchronised by the control means 60 with the switching of the control switch elements 51 to 55, such that the respective switch elements 1 of the voltage storage circuits $VSC_1$ and $VSC_2$ are maintained in the ON condition when the switch elements 51 to 54 are initially in the ON condition but are turned OFF before those elements 51 to 54 are switched to the OFF condition.

In operation of the FIG. 11 voltage doubling circuitry, the control signal $\phi_1$ is initially activated so that the controllable switch elements 51 to 54 are initially switched to the ON condition, the switch element 55 being OFF at this time. Thus, when $\phi_1$ is active the switch elements 51 to 55 are in an input configuration which permits an input voltage $V_i$ between the input nodes $I_1$ and $I_2$ to be applied between the respective input and common terminals of each of the voltage storage circuits $VSC_1$ and $VSC_2$.

While the switch elements 51 to 55 are in this input configuration, the respective switch elements 1 of the voltage storage circuits $VSC_1$ and $VSC_2$ are controlled by their associated switch driving device 4,5 to be in the ON condition. As a result, the respective storage capacitors 2 thereof are each charged to the input voltage $V_i$. In this respect, it is to be noted that the input voltage is applied with reverse polarity to the second voltage storage circuit $VSC_2$ as compared with the first voltage storage circuit $VSC_1$.

While the switch elements 51 to 54 are still turned ON, the control means 60 apply the switching signal CK to the respective switch driving means 4,5 of the voltage storage circuits in order to switch OFF the respective switch elements 1 of the voltage storage circuits. As a result, the input voltage $V_{is}$ at the moment of switching $t_{switch}$ is stored in the respective storage capacitors 2 of the voltage storage circuits.

Thereafter, the control means 60 deactivates the control signal $\phi_1$, so that the switch elements 51 to 54 are switched OFF, and then activates the control signal $\phi_2$ so that the switch element 55 is switched ON. In this condition, the switch elements 51 to 56 are in an output configuration. In this output configuration, the respective storage capacitors 2 of the voltage storage circuits $VSC_1$ and $VSC_2$ are connected in series between the respective inputs of the amplifier elements 3 of the voltage storage circuits $VSC_1$ and $VSC_2$. Since these amplifier elements 3 of the voltage storage circuits serve only to reproduce at their respective outputs the potentials at their inputs, the output voltage $V_o$ produced between the first and second output nodes $O_1$ and $O_2$ is substantially equal to double the stored input voltage Vis, i.e. $V_o=2V_{is}$.

Accordingly, the circuitry 50 serves to provide an output voltage $V_o$ which is substantially double the applied input voltage $V_i$ at the moment of switching $t_{switch}$.

The circuitry of FIG. 11 is capable of providing very high accuracy in voltage doubling because the effects of parasitic capacitance in the circuitry are minimised. This is because in a voltage storage circuit constituted as described hereinbefore, the parasitic capacitances which affect the applied input signal (i.e. the capacitance of the input switch element 1, the capacitance at the input of the amplifier element 3, and any interconnect capacitance in the voltage storage circuit) can all be bootstrapped In view of the fact that the voltage storage circuits should preferably be formed in respective wells (to permit bootstrapping of the interconnect capacitance of the voltage storage circuits), the entire voltage doubling circuitry 50 should preferably be formed as an integrated circuit.

It should be noted that this approach to voltage doubling is fundamentally different from that adopted in previously-considered switched-capacitor circuits used to perform voltage doubling. In these previously-considered circuits, the circuit operation is designed to be insensitive to parasitic capacitances by ensuring that all nodes in the circuit are either driven by amplifiers (so that the parasitic capacitances are charged by the amplifier outputs and have no effect), or are always returned to the same voltage on all clock phases ("virtual ground" design so that no net charge flows into or out of the parasitic capacitances). An example of the latter approach is provided in EP-B-0214831.

By designing the circuits to be insensitive to parasitic capacitances, the problems caused by parasitic capacitances per se are eliminated, but the elision of parasitic problems leads to a different problem, associated with inevitable mismatch between the capacitors used to store and double the input voltage which prevents desirably high accuracy from being achieved.

This problem arises because in previously-considered voltage doubling circuits based on switched capacitors, the variable which is conserved during a voltage doubling operation is charge (transferred from one capacitor to another) rather than voltage as in the FIG. 11 circuitry.

Considering this problem in more detail, to double a voltage when charge is conserved, a capacitor of value 2C (or two capacitors, each of value C, in parallel) is charged to the input voltage, and then all the charge is transferred to a single capacitor of value C (which may or may not be one of the originally-charged capacitors). Conservation of charge gives:

$$2C.V_{in}=C.V_{out}$$

$$V_{out}=2V_{in}$$

However, it is found that in practical circuits the output voltage $V_{out}$ is not precisely double the input voltage $V_{in}$, and this is due to mismatch between the respective capacitances of the capacitors used to perform the voltage doubling operation. In this respect, if the respective capacitances of the two capacitors that are charged to the input voltage $V_{in}$ are $C_1$ and $C_2$ respectively, and the capacitance $C_3$ of a third capacitor which receives the combined charge stored in those two capacitors is $C_3$, conservation of charges gives:

$$(C_1+C_2)\cdot V_{in}=C_3\cdot V_{out}$$

$$V_{out}=[(C_1+C_2)/C_3]V_{in}$$

Random mismatches between nominally identical capacitors are typically between 0.1% (relatively easy to achieve on an integrated circuit) and 0.01% (extreme precautions required, for example large capacitors split into units and interleaved). Such capacitance matching error results in a comparable error in the doubled voltage and, when the voltage doubling circuit is employed in an analog-to-digital converter for example, the linearity of the analog-to-digital converter can be limited to between 10 and 13 bits by such error.

Error due to capacitance mismatch in such previously-considered charge-transfer based voltage doubling circuits can be eliminated by using complicated switching arrangements. One previously considered method is to charge a capacitor $C_1$ to the input voltage, transfer the charge to a storage capacitor $C_2$, charge $C_1$ to the input voltage again, and then transfer all the charge back onto $C_1$. This results in an exact doubling voltage of the input because the charge starts and finishes on the same capacitor, but this method is more complex, slower (involving more clock phases), and more sensitive to amplifier switching noise.

Another previously-considered method is to "auto-calibrate", i.e. provide additional circuitry which measures the capacitor mismatch and adjusts for it. The provision of such circuitry, however, adds to circuit complexity and reduces speed of operation.

Furthermore, the previously-considered voltage doubling circuits which rely on charge transfer also rely effectively on the capacitors being linear, so that doubling the charge on a capacitor necessarily doubles the voltage across it. Depending on the physical structure of the capacitor, non-linearity of the capacitors used in those previously-considered voltage doubling circuits can also limit the linearity of the voltage doubling circuit as a whole.

Figure 1:
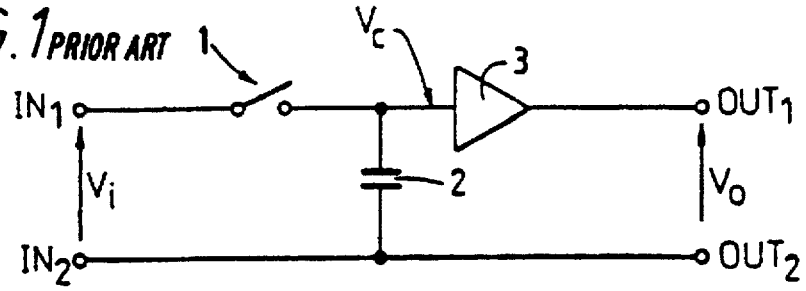
FIG. 1 PRIOR ART
FIG. 1 (PRIOR ART), discussed hereinbefore, shows a circuit diagram of a previously-considered voltage storage circuit.
Figure 2:
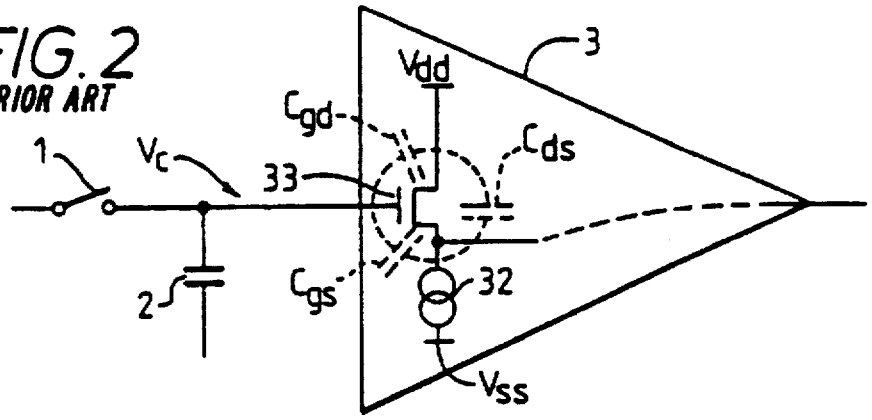
FIG. 2 PRIOR ART
FIG. 2 (PRIOR ART), also discussed hereinbefore, shows in more detail an amplifier element included in the FIG. 1 circuit.

In the FIG. 1 circuit, on the other hand, the requirement for highly linear, accurately-matched capacitors is eliminated. Charging two capacitors in parallel and then connecting them in series will always exactly double the input voltage regardless of the matching and linearity of the capacitors, provided that the effects of parasitic capacitances can be cancelled out satisfactorily.

In the FIG. 11 circuitry, since the bootstrap switch driving device 4.5 of each voltage storage circuit ensure that the charge injection of the switch elements 1 is kept constant, then provided that the voltage storage circuits are designed so that all parasitic capacitances therein are driven by the amplifier element outputs, substantially the only limit on linearity of operation is gain error of the amplifier elements. This is because the parasitic capacitance cancellation is not fully effective if the gains of the amplifier elements of the voltage storage circuits are not exactly unity. This gain error from exactly unity should therefore be minimised.

In practice this gain error can be made as small as is required by the desired precision of the particular voltage doubling application (although to obtain optimum accuracy a relatively complex amplifier element construction will be required). By adopting a suitable amplifier element construction this means that a linearity of at least 1ppm or better should be achievable, the actual performance limit being dependent then upon random noise due to amplifier and thermal (kT/C) noise. In an analog-to-digital converter using such voltage doubling circuitry, linearity could be maintained in excess of 20 bits.

Finally, by virtue of the back-to-back connection of two voltage storage circuits $VSC_1$ and $VSC_2$ in the voltage doubling circuitry 50 of FIG. 11, the respective amounts of charge injected by the switch elements 1 of the circuits at the moment of switching effectively cancel out, making the circuitry self-compensating.

An example of the use of voltage doubling circuitry 50 such as that shown in FIG. 11 will now be given with reference to FIG. 12.

Figure 12:
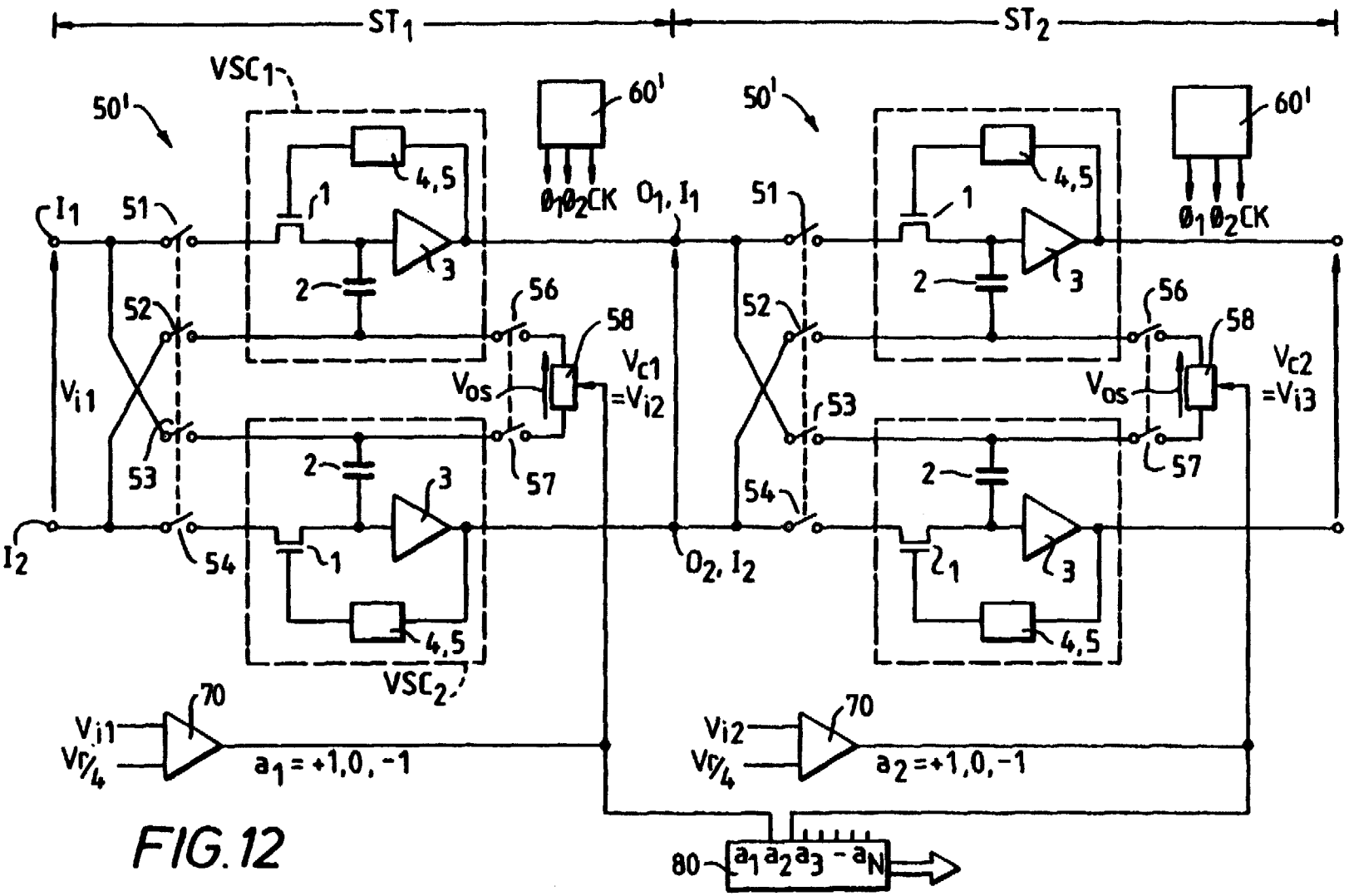
FIG. 12 shows a circuit diagram of parts of an analogue-to-digital converter having a plurality of conversion stages each based upon the voltage doubling circuitry of FIG. 11.

FIG. 12 shows parts of an analog-to-digital converter (ADC) employing voltage doubling circuitry as shown in FIG. 11. The FIG. 12 ADC is a "three-state logic" ADC.

A three-state logic ADC performs its analog-to-digital conversion by carrying out a series of voltage conversion operations, starting with an applied analogue input voltage, each involving a voltage doubling operation. Digital data is produced in each such voltage conversion operation, the digital data from the successive conversion operations being combined to produce a digital output word representative of the applied analog input voltage.

In each voltage conversion operation performed by a three-state logic ADC, in a first phase of the operation an analog input voltage is compared with a predetermined comparison potential $V_r/4$, where $V_r$ is a predetermined reference potential, to produce one of three digital data values as indicated in Table 1 below.

TABLE 1

| Result of Comparison | Digital Data |
|---|---|
| $V_r/4 \leqq V_i$ | +1 |
| $-V_r/4 \leqq V_i < V_r/4$ | 0 |
| $V_i < -V_r/4$ | −1 |

Then, in a second phase of the operation, in dependence upon the digital data produced in the first phase the input voltage $V_i$ is converted to produce an analog conversion voltage $V_c$ which is related to $V_i$ by the expressions indicated in Table 2 below.

TABLE 2

| Digital Data | Analog Conversion Voltage $V_c$ |
|---|---|
| +1 | $2V_i - V_r$ |
| 0 | $2V_i$ |
| −1 | $2V_i + V_r$ |

In the next conversion operation this analog conversion voltage $V_c$ is used as the analog input voltage, the conversion voltage $V_c$ converging in successive such operations towards zero. Each successive conversion operation produces one "bit" of three-state logic digital data (+1, 0, −1). An output word expressed in normal binary (two-state) logic can be derived from all the three-state bits in combination by suitable digital logic circuitry, R three-state bits producing a binary logic output word consisting of (R+1) bits.

A fuller description of the operation of a previously-considered three-state logic ADC is provided in "Fujitsu Facts: Three-states logic controls CMOS cyclic A/D converter is used in MB87020" by K. Gotoh and O. Kobayashi, and in EP-B-0214831, both of which documents are incorporated herein by reference.

The ADC of FIG. 12 comprises N voltage conversion stages $ST_1, ST_2, \ldots ST_N$ connected in series, each of which is capable of performing a voltage conversion operation as described above with reference to Table 1 and 2. Only the first two such voltage conversion stages $ST_1$ and $ST_2$ of the ADC are illustrated in FIG. 12.

Each of the stages $ST_i$ is based upon voltage doubling circuitry 50' generally as described hereinbefore with reference to FIG. 11, the input nodes $I_1$ and $I_2$ of the voltage doubling circuitry 50' providing input nodes of the stage, and the output nodes $O_1$ and $O_2$ of the voltage doubling circuitry 50' similarly providing output nodes of the stage.

The voltage doubling circuitry 50' of each stage $ST_i$ differs from the FIG. 11 voltage doubling circuitry, however, in that in place of the single switch element 55 of the FIG. 11 circuitry, the voltage doubling circuitry 55' has, connected in series between the respective common terminals $COM_1$ and $COM_2$ of the two voltage storage circuits $VSC_1$ and $VSC_2$ of the circuitry, two controllable switch elements [55] *56* and [56] *57* and voltage adjustment means 58.

In each stage $ST_i$, the switch elements 51 to [56] *54, 56 and 57* can be in either the above-mentioned input configuration (switch elements 51 to 54 in the ON condition whilst switch elements [55] *56* and [56] *57* are in the OFF condition) or in the output configuration (switch elements [55] *56* and [57] *57* in the ON condition whilst switch elements 51 to 54 are in the OFF condition).

As in the case of the voltage doubling circuitry 50 of FIG. 11, the switch elements 51 to *54*, 56 *and 57* of each stage $ST_i$ are controlled by control signals $\phi_1$ and $\phi_2$. However, in the ADC of FIG. 12 control means 60' common to all the stages are provided for generating the first and second control signals of each stage and, when $\phi_1$ is active the switch elements 51 to *54*, 56 *57* of the odd-numbered stages $ST_1$, $ST_3$, $ST_5$, . . . are maintained in the input configuration whilst the switch elements 51 to *54*, 56 *57* of the even-numbered stages $ST_2$, $ST_4$, $ST_6$, . . . are maintained in the output configuration, and vice versa when $\phi_2$ is active.

Each voltage conversion stage $ST_i$ also includes comparator means 70 connected to the first and second input nodes $I_1$ and $I_2$ of the stage for receiving the input voltage $V_i$ applied to the stage and also connected to receive the above-mentioned comparison potential $V_r/4$. The comparator means 70 provide at the output thereof three-state logic digital data a (+1, 0, −1), serving as the digital output of the stage, in accordance with Table 2 above. The digital data of each stage is applied to data processing means 80 for processing to produce a digital output word. The digital data a is applied also to the voltage adjustment means 58 for controlling operation thereof.

The voltage adjustment means serve, when the switch elements [55] *56* and *57* are ON, to apply between the respective common terminals $COM_1$ and $COM_2$ of the voltage storage circuits of the stage an offset voltage $V_{os}$ selected, from one of three different possible voltages, by the digital data a produced by the comparator means. In the case in which a=+1 (corresponding to the case in which $V_r/4 \leqq V_i$,) the selected offset voltage $V_{os}=-V_r$. When a=0 (corresponding to the case in which $-V_r/4 \leqq V_i < V_r/4$) the selected offset voltage $V_{os}=0$. When a=−1 (corresponding to the case in which $V_i < -V_r/4$) the selected offset voltage $V_{os}=+V_r$.

In operation of the ADC shown in FIG. 12, an analog input voltage $V_{i1}$ to be digitised is applied between the first and second input nodes $I_1$ and $I_2$ of the first voltage conversion stage $ST_1$. Initially, the control means 60' activates the control signal $\phi_1$, so that the first voltage conversion stage $ST_1$ is maintained in the input configuration (switch elements 51 to 54 thereof ON). In this configuration the switch elements [55 and] 56 *and 57* are both maintained in the OFF condition, so that the voltage adjustment means 58 are isolated from the rest of the circuitry.

While $\phi_1$ is active the comparator means 70 of the first stage $ST_1$ compare the applied input voltage $V_i$ with the comparison potential $V_r/4$ and produce three-state logic digital data a in dependence upon the result of the comparison.

Before the end of the period during which $\phi_1$ is active, the switching signal CK is applied by the control means 60' to each switch driving device 4,5 of the first stage $ST_1$ to cause the respective switch elements 1 of the voltage storage circuits $VSC_1$ and $VSC_2$ of the stage $ST_1$ to be switched OFF, with the result that the input voltage $V_{i1}$ the first stage $ST_1$ is stored in each of the respective storage capacitors 2 of those circuits.

The control means 60' then deactivates $\phi_1$ and activates $\phi_2$ to switch the first stage $ST_1$ to the output configuration. In this configuration, the switch elements 51 to 54 of the stage are in the OFF condition, and the switch elements [55 and] 56 *and 57* of the stage are in the ON condition. The voltage adjustment means 58 are therefore connected in series between the respective storage capacitors 2 of the voltage storage circuits $VSC_1$ and $VSC_2$, so that the selected offset voltage $V_{os}$ ($-V_r$, 0, $+V_r$ depending on the digital data a) is applied between the respective common terminals $COM_1$ and $COM_2$ of the voltage storage circuits $VSC_1$ and $VSC_2$. Thus, an analog conversion voltage $V_c$ is produced between the first and second output nodes $O_1$, $O_2$ of the stage $ST_1$ which differs from double the stored input voltage $V_{i1}$ by the selected offset voltage $V_{os}$ applied between the respective common terminals $COM_1$, $COM_2$ of the voltage storage circuits $VSC_1$ and $VSC_2$ by the voltage adjustment means 58 (i.e. $V_{c1}=2v_{i1}+V_{os}$).

Thus, in accordance with Table 2 above the conversion voltage $V_{cl}$ produced by the voltage conversion stage $ST_1$ can be $2V_{i1}-V_r$, $2V_{i1}$, or $2V_{i1}+V_r$ depending upon the result of the comparison between $V_{i1}$ and the comparison potential $V_r/4$.

As shown in FIG. 12, the voltage conversion stages of the ADC are connected in series, so that the second voltage conversion stage $ST_2$ receives as its input voltage $V_{i2}$ the analog conversion voltage $V_{cl}$ produced by the first voltage conversion stage $ST_1$. As noted above, the switch elements 51 [to 56] *-54*, 56, *57* of the second stage $ST_2$ are controlled $\phi_2$ to be in the input configuration when the switch elements 51 [to 56] *-54*, 56, *57* of the first stage $ST_1$ are in the output configuration, so that the second stage $ST_2$ can begin to perform its comparison operation on the conversion voltage $V_{cl}$ produced by the first stage $ST_1$ without delay. The switching signal CK for the switch driving device 4,5 of the second stage $ST_2$ is accordingly generated while $\phi_2$ is active (rather than while $\phi_1$ is active as was the case with the switch driving device 4,5 the first conversion stage $ST_1$ ), so that the analogue conversion voltage $V_{cl}$ of the first stage $ST_1$ is stored in the second stage $ST_2$. After the end of the period during which $\phi_2$ is active, $\phi_1$ is activated again, causing the second stage $ST_2$ to be switched to the output configuration. It therefore produces is analogue conversion voltage $V_{c2}$ in dependence upon the analogue conversion voltage $V_{c1}$ of the preceding (first) stage.

The analog conversion voltage $V_{c2}$ is applied to the input of the next stage $ST_3$, and is converted in turn (during the next period during which $\phi_1$ is active) to an analogue conversion voltage $V_{c3}$. Successive voltage conversion operations are thus performed at each "swap" in the activation of the control signals $\phi_1$ and $\phi_2$. The periods $t_1$ and $t_2$ during which the control signals $\phi_1$ and $\phi_2$ are respectively active constitute first and second clock phases of the converter, the second phase commencing after the end of the first clock phase in each successive clock period of the converter.

Since the first stage $ST_1$ is switched back to the input configuration when the second stage $ST_2$ is switched to the output configuration (to convert the analog conversion voltage $V_{c1}$ just provided by the first stage into the analog conversion voltage $V_{c2}$) a new analogue input voltage can be received by the converter each time $\phi_1$ is reactivated. In this way, the ADC can produce a new conversion result (a digital output word based on N three-state bits) in every clock period.

It is not essential that the comparator means 70 of a given stage directly compare the applied input voltage of the stage with the comparison potential. The comparison could be between the [comparator] *comparison* potential, on the one hand, and, on the other hand, the input voltage as stored in the voltage storage circuits, or an initial analogue conversion voltage provided by the stage prior to the comparison (the analogue conversion voltage subsequently being corrected).

In place of the N stages used in FIG. 12, it would alternatively be possible to use just two voltage conversion stages operating iteratively with each one alternatively sampling the output of the other. This arrangement would take one clock period (i.e. 2 clock phases) to produce every two bits of three-state logic digital data. Thus, to perform an N bit conversion, the arrangement would take N/2 clock periods, which is much slower than a converter employing N stages. The amount of circuitry required would however be decreased.

In a different aspect of the present invention, it is also possible to construct a three-state logic ADC employing just one voltage conversion stage operating iteratively, although in this case the voltage conversion stage must employ voltage storage circuits constructed differently from the voltage storage circuits in the conversion stages $ST_i$ in the FIG. 12 ADC, as described below with reference to FIG. 13.

Figure 13:
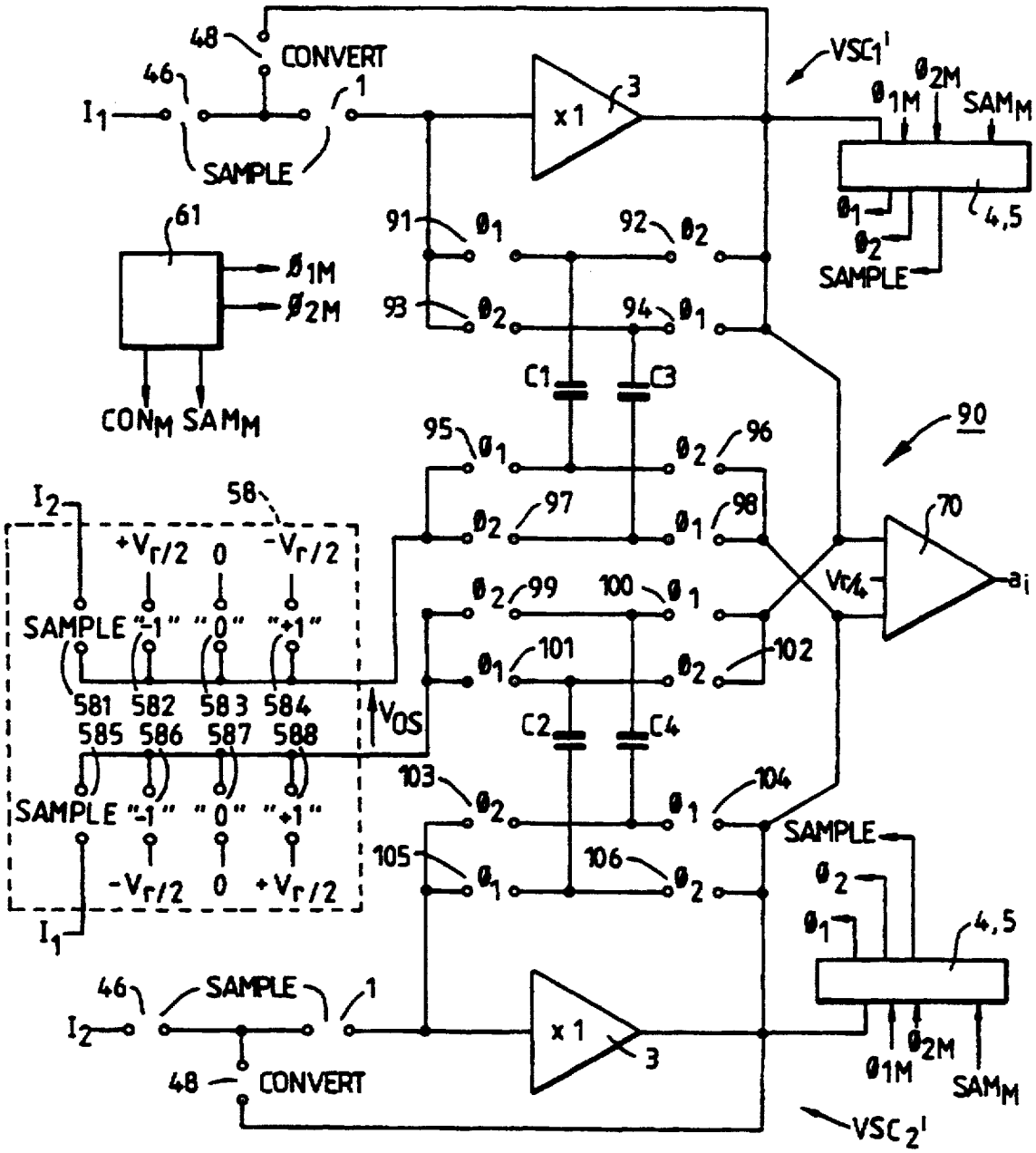
FIG. 13 shows a circuit diagram of parts of an analogue-to-digital converter, having a single conversion stage, embodying the aforesaid second aspect of the present invention.

In FIG. 13 a voltage conversion stage 90 for use in a three-state logic ADC includes first and second modified voltage storage circuits $VSC_1'$ and $VSC_2'$ connected respectively to first and second input nodes $I_1$ and $I_2$ of the voltage conversion stage 90.

Each modified voltage storage circuit includes an input switch element 1, a unity-gain amplifier element 3 and bootstrapped switch driving device 4, 5 as described hereinbefore with reference to FIGS. 3 to 9(B). However, in place of the single capacitor 2 in the voltage storage circuit of FIG. 3, each modified voltage storage circuit includes two capacitors, labelled $C_1$ and $C_3$ in the case of the first modified voltage storage circuit $VSC_1'$, and $C_2$ and $C_4$ in the case of the second modified voltage storage circuit $VSC_2'$. The capacitors $C_1$ to $C_4$ are normally of the same capacitance, but this is not essential for correct operation of the voltage conversion stage 90.

Each modified voltage storage circuit also includes a number of switch elements 91 to 106, there being four switch elements associated with each capacitor $C_1$ to $C_4$. Thus, the switch elements 91, 92, 95 and 96 are associated with the capacitor $C_1$, the switch elements 101, 102, 105 and 106 are associated with the capacitor $C_2$, the switch elements 93, 94, 97 and 98 are associated with the capacitor $C_3$, and the switch elements 99, 100, 103 and 104 are associated with the capacitor $C_4$.

The switch elements 91 to 106 are turned on and off in accordance with control signals $\phi_1$ and $\phi_2$ produced by the bootstrapped switch driving means, as explained in more detail hereinafter.

Associated with each modified voltage storage circuit $VSC_1'$ or $VSC_2'$ is an input isolation switch element 46 connected in series with the input switch element 1 between that element and the relevant input node $I_1$ or $I_2$ of the voltage conversion stage 90, and a feedback switch element 48 connected between an output node of the modified voltage storage circuit (at the output terminal of the amplifier element 3) and the input side of the input switch element 1. The input isolation switch element 46 and feedback switch element 48 correspond to the switch elements of the same name and reference numeral in the voltage summation circuitry of FIG. 10, and serve the same purpose. The feedback switch elements 48 can alternatively be replaced by resistors.

Voltage adjustment means 58, generally similar to the voltage adjustment means 58 in FIG. 12, are connected between the first and second modified voltage storage circuits $VSC_1'$ and $VSC_2'$. Furthermore, comparator means 70, similar to the comparator means of each voltage conversion stage $ST_i$ in FIG. 12, are connected between the respective output nodes of the modified voltage storage circuits.

The voltage adjustment means 58 includes a further plurality of switch elements 581 to 588. The six switch elements 582 to 584 and 586 to 588 are activated in pairs in dependence upon the logic level of the three-state data "bit" $a_i$ produced by the comparator means. In this way, when $a_i=-1$ the switch elements 582 and 586 are activated and as a result an offset voltage $V_{os}$ generated between the output terminals of the voltage adjustment means 58 is equal to $+V_r$, where $V_r$ is a predetermined reference voltage; when $a_i=0$ the switch elements 583 and 587 are activated and the offset voltage $V_{os}$ is zero; and when $a_i=+1$ the switch elements 584 and 588 are activated and the offset voltage $V_{os}$ is equal to $-V_r$.

The activation of the other two switch elements 581 and 585 in the voltage adjustment means 58, which are connected respectively to the second and first input nodes $I_2$ and $I_1$ of the stage 90, will be explained below.

Control means 61, generally similar to the control means 60' in FIG. 12, are operative to generate not only master control signal $\phi_{1M}$ and $\phi_{2M}$, but also respective further master control signals $SAM_M$ and $CON_M$. The master control signals $\phi_{1M}$, $\phi_{2M}$ $SAM_M$ are applied to the bootstrapped switch driving means 4,5 of each modified voltage storage circuit. The bootstrapped switch driving means of each modified voltage storage circuit generate bootstrapped control signals $\phi_1$, $\phi_2$ and SAMPLE, in accordance with the corresponding master control signals $\phi_{1M}$, $\phi_{2M}$ and $SAM_M$, for application to the switch elements of the modified voltage storage control signals tracking the output terminal potential of the amplifier element 3 in the modified voltage storage circuit. A further control signal CONVERT, used to activate the feedback switch element 48 associated with each modified voltage storage circuit, may be a bootstrapped control signal derived from the master signal $CON_M$, but can alternatively be provided directly by the master signal $CON_M$ since it is not essential for the signal applied to the feedback switch elements 48 to be bootstrapped.

At the start of a conversion operation by the voltage conversion stage 90 of FIG. 13, an analogue input voltage to be converted into its digital equivalent is applied between the first and second input nodes $I_1$ and $I_2$ of the voltage conversion stage 90. To facilitate sampling of the applied analogue voltage, the control means 61 generates the master control signal $SAM_M$ which activates the associated bootstrapped control signals SAMPLE in each modified voltage storage circuit to connect the input nodes $I_1$ and $I_2$ via the switch elements 1 and 46 to the respective inputs of the amplifier elements 3 in the modified voltage storage circuits. At this time, the CONVERT control signal is deactivated, so that the feedback switch elements 48 are in the off condition The switch elements 581 and 585 in the voltage adjustment means 58 are also activated by the control signal SAMPLE, so that the output terminal potentials of the voltage adjustment means are equal respectively to the potentials of the second and first input nodes $I_2$ and $I_1$. The other switch elements 582 to 584 and 586 are maintained in the off condition at this time.

Assuming that during sampling of the input voltage the control signal $\phi_1$ is active, the switch elements 91, 95, 101 and 105 will be in the on condition, so that the capacitor $C_1$ in the first modified voltage storage circuit $VSC_1'$ has its top plate connected to the first input node $I_1$ and its bottom plate connected to the second input node $I_2$. Similarly the capacitor $C_2$ in the second modified voltage storage circuit $VSC_2'$ has its top plate connected to the second input node $I_2$ and its bottom plate connected to the first input node $I_1$. Each capacitor $C_1$ and $C_2$ therefore stores the applied analogue input voltage, so as to achieve sampling of that input voltage.

Whilst the control signal $\phi_1$ is active, the switch elements 94, 98, 100 and 104 are in the on condition, so that the capacitors $C_3$ and $C_4$ are connected in parallel with one another between the respective output terminals of the amplifier elements 3. Because the amplifier elements have unity gain, the sampled analogue input voltage is also stored in each of the capacitors $C_3$ and $C_4$ during $\phi_1$.

The SAMPLE control signal is then deactivated, so as to terminate the sampling of the input voltage, the control signal $\phi_1$ remaining active.

After the SAMPLE control signal is deactivated, the CONVERT control signal is activated for the remainder of a conversion operation. Because the input and output terminal potentials of the unity-gain amplifier element 3 are always equal, the input-side and output-side terminals of the input switch element 1 are maintained at the same potential, so that element 1 is maintained safely in the off condition, irrespective of subsequent changes in the potential of the associated input node $I_1$ or $I_2$.

The sampled input voltage which is held by the capacitors $C_3$ and $C_4$, is compared by the comparator means 70 with a predetermined comparison potential $V_r/4$ in the same way as in the FIG. 12 ADC. A first "bit" $a_1$ of three logic digital data (+1, 0, −1) is produced by the comparator means 70 in dependence upon the result of the comparison (see Table 1 above).

After the first data bit $a_1$ is obtained, a pair of the switch elements 582 to 584 and 586 to 588 in the voltage adjustment means 58 is activated according to the first data bit $a_1$. The voltage adjustment means 58 thus produces one of its predetermined offset voltages $V_{os}$ ($-V_r$, 0, $+V_r$ depending on the digital data bit $a_1$) between its output terminal. With the control signal $\phi_1$ still active, the switch elements 91, 95, 101, and 105 are all still in the on condition, so that a first series connection now exists between the respective input terminals of the switch elements 3. This first series connection consists of the capacitor $C_1$, the voltage adjustment means 58 and the capacitor $C_2$. Thus, the voltage between the respective input terminals of the amplifier element 3 is a first conversion voltage $V_{c1}$ equal to twice the sampled analogue input voltage stored in the capacitors $C_1$ and $C_2$ plus the offset voltage $V_{os}$ selected by the first data bit $a_1$. In this way, a voltage conversion operation, in accordance with Table 2 above, is performed.

The input terminal potentials of the amplifier elements 3 are buffered by the amplifier elements 3, so that the first conversion voltage $V_{c1}$ is reproduced between the respective output terminals of the amplifier elements 3.

The switch elements 94, 98, 100 and 104 are all still in the on condition, so that the capacitors $C_3$ and $C_4$ are connected in parallel with one another between the respective output terminals of the amplifier elements 3, and each store the first conversion voltage $V_{c1}$.

The first conversion voltage $V_{c1}$ is compared by the comparator means 70 with the comparison potential $V_r/4$, and a second data bit $a_2$ is produced in dependence upon the result of the comparison.

The control means then deactivates the control signal $\phi_1$ and activates the control signal $\phi_2$. At the same time, the second data bit $a_2$ is applied to the voltage adjustment means to select a new offset voltage $V_{os}$ in accordance with that data bit $a_2$. With $\phi_2$ active the switch elements 93, 97, 99 and 103 are in the on condition. As a result, the capacitors $C_3$ and $C_4$ are connected in series with the voltage adjustment means 58 to form a second series connection ($C_3$-$V_{os}$-$C_4$), in place of the first series connection ($C_1$-$V_{os}$-$C_2$) mentioned above, between the respective input terminals of the amplifier elements 3. The resulting new conversion voltage $V_{c2}$, produced between the respective output terminals of the amplifier elements 3, is therefore equal to twice the first conversion voltage $V_{c1}$ plus the new selected offset voltage $V_{os}$. With $\phi_2$ active the switch elements 92, 96, 102 and 106 are in the on condition, so that this new conversion voltage $V_{c2}$ is stored in the capacitors $C_1$ and $C_2$ which are connected in parallel between the respective output terminals of the amplifier elements 3.

The new conversion voltage $V_{c2}$ is compared with the comparison potential $V_r/4$ in the comparator means 70 to produce the nest data bit $a_3$. The control signal $\phi_2$ is then deactivated the control signal $\phi_1$ is activated, and the data bit $a_3$ is applied to the voltage adjustment means to select a new offset voltage $V_{os}$. With $\phi_1$ active the first series connection ($C_1$-$V_{os}$-$C_2$) replace the second series connection ($C_3$-$V_{os}$-$C_4$) between the amplifier element input terminals and the capacitors $C_3$ and $C_4$ store the resulting new conversion voltage $V_{c3}$.

Thereafter, the control signals $\phi_1$ and $\phi_2$ are activated alternatively, a new data bit $a_i$ and new conversion voltage being produced during each successive control signal phase.

As described before with reference to FIG. 12, the data bits $a_i$ are applied to data processing means 80 (not shown) of the ADC for processing to produce a digital output word representative of the originally-applied analogue voltage. It will be understood that the FIG. 13 voltage conversion stage requires N clock phases to produce a digital output word based on N three-state bits.

It will be appreciated that the switch elements 1, 48, 91, 92, 93 and 94 in the first modified voltage storage circuit $VSC_1'$, and the corresponding switch elements 1, 48, 103, 104, 105 and 106 in the second modified voltage storage circuit $VSC_2'$, each have no voltage across their two terminals when either $\phi_1$ or $\phi_2$ is active, since, for each amplifier element 3, the input terminal potential is equal to the output terminal potential.

The switch elements 91 to 94 and 103 to 106 connected to the capacitor top plates can switch without non-overlap (i.e. without delay after switch-off of, say, element 91 before element 92 can be switched on) since all of the four nodes to which these elements are connected (amplifier element input terminal, amplifier element output terminal, and the respective top plates of the two capacitors) have the same voltage before and after switching (i.e. before and after each control signal phase change from $\phi_1$ to $\phi_2$ or vice versa). This ability to switch the top plate switches 91 to 94 and 103 to 106 without nonoverlap simplifies the generation of the control signals.

It should be noted that the switches 95 to 102 connected to the capacitor bottom plates should be switched a predetermined short time after switching of the switch elements 91 to 94 and 103 to 106 connected to the capacitor top plates, in order to avoid charge injection effects. The predetermined short time should be minimised in view of the fact that during this time the input terminal of each amplifier element 3 is effectively coupled to the output terminal of the other amplifier element, so that positive feedback can occur. The effects of this positive feedback are not serious in view of the fact that the amplifier elements have unity gain, but none the less it is preferable to avoid leaving the voltage conversion stage 90 in this condition for longer than is absolutely necessary. Thus, as soon as the top plate switch elements 91 to 94 and 103 to 106 have settled, the bottom plate switch elements 95 to 102 are switched.

The switch elements 1 and 91 to 94 in the first modified voltage storage circuit $VSC_1'$ should preferably be formed in one or more wells of the opposite conductivity type to that of the surrounding material of the substrate, the potential of the or each well being fixed in relation to the output terminal potential of the amplifier element 3 in the first modified voltage storage circuit. The same applies to the switch elements 1 and 103 to 106 in the second modified voltage storage circuit $VSC_2'$. This arrangement of the switch elements enables parasitic capacitances in the modified voltage storage circuit to be bootstrapped out, in the same basic manner as described hereinbefore with reference to the voltage storage circuit of FIGS. 3 to 9.

In the FIG. 13 voltage conversion stage, the first voltage conversion operation is performed during the initial clock phase in which the analogue input voltage is sampled, immediately after sampling is complete. This speeds up operation of the converter, but does require the provision of extra switch elements (the elements 581 and 585 shown incorporated in the voltage adjustment means 58) to charge the capacitor bottom plates of the capacitors $C_1$ and $C_2$ to the input node potentials during sampling. It would be possible to omit these switch elements 581 and 585 and simply perform a comparison operation in the initial clock phase (to obtain $a_1$), the first voltage conversion operation being performed in the next clock phase.

A voltage conversion stage as described above with reference to FIG. 12 or 13 is applicable, with suitable modifications, to other analogue-to-digital converters that require voltage doubling and offsetting operations.

In order to minimise power consumption of an ADC employing a series of voltage conversion stages as described above with reference to FIG. 12, it is advantageous to "scale" successive stages. This will now be discussed in more detail with reference to FIG. 14.

In FIG. 14 the first three stages of an ADC as shown in FIG. 12 are represented schematically. The storage capacitors 2 in the first stage each have a capacitance C, the transistors in the amplifier element 3 are each of channel width W, and the current flowing through each of those transistors in the amplifier element 3 is I.

In the second stage, the storage capacitors 2 are each of capacitance kC, where 1/k is a predetermined scaling factor (k<1) the transistors in the amplifier elements 3 are each of width kW, and the current flowing through each transistor is kI. Similarly, in the third stage the capacitance is $k^2C$, the transistor channel width $k^2W$, and the transistor current $k^2I$.

Thus each successive stage is scaled, at least insofar as these three parameters are concerned, by the scaling factor 1/k. As a result, the total current consumed in the device, expressed in relation to the current consumed by the first stage, is $$1+k+k^2+k^{3+}\ldots$$

Each stage has a noise power at its own input of 1/k but, relative to the input terminal of the ADC, this is reduced by the product of the gains of the preceding stages. For example, the second stage noise power=1/k, the voltage gain of the preceding stages (in this case the voltage gain of the first stage)=2, and hence the noise power, relative to the input noise power, is ¼k.

Thus, total noise power at the input for all the stages is $$1+\frac{1}{4k}+\frac{1}{16k^2}+\frac{1}{64K^3}+\ldots$$

When k=½, for example, total noise=1+½+¼+⅛ . . . =2

Similarly substituting k=½ in the total current equation above, total current=1+½+174+⅛ . . . =2

For a constant total power all sizes must then be divided by the result of the power summation, i.e. input noise is multiplied by the same factor.

$$\begin{aligned}\text{Input noise} &= \Sigma\text{noise}\cdot\Sigma\text{power}\\ &= (1+k+k^2+\ldots)\cdot\left(1+\frac{1}{4k}+\frac{1}{16k^2}+\frac{1}{64k^3}+\ldots\right)\end{aligned}$$

Let $m = 2k$ $$\begin{aligned}\text{Input Noise} &= \left(1+\frac{m}{2}+\frac{m^2}{4}+\ldots\right)\cdot\left(1+\frac{1}{2m}+\frac{1}{4m^2}+\ldots\right)\\ &= \left(1+\frac{1}{2}m+\frac{1}{4}m^2+\ldots\right)\cdot\left(1+\frac{1}{2}m^{-1}+\frac{1}{4}m^{-2}+\ldots\right)\end{aligned}$$

This is a minimum when m=1, i.e. k=½.

From the above analysis, it will be apparent that the optimum scaling factor for minimum, total power consumption of the ADC should be 2. This provides a minimum noise level for a given power consumption or a minimum power consumption level for a given noise level Thus, each stage should be substantially half the size of the preceding one In this case the total power consumption equals two times the power consumption of the first stage, and the total noise power equals two times the first stage noise power.

Figure 15:
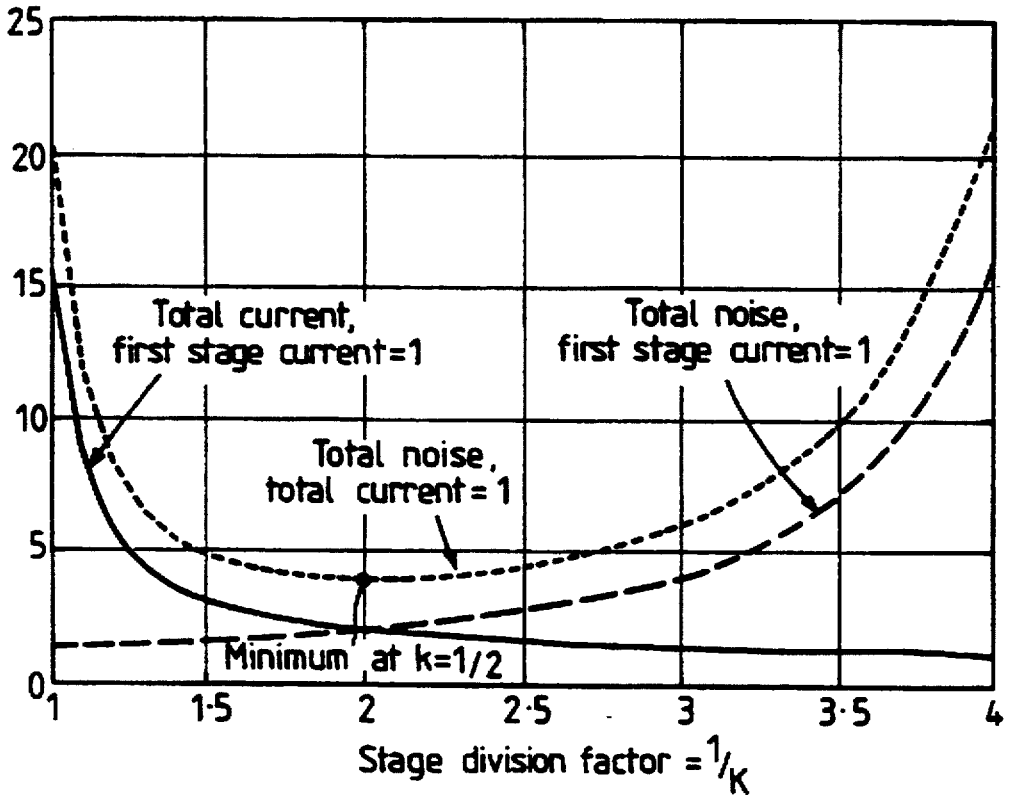
FIG. 15 is a graph illustrating, in the case of a converter as shown in FIG. 12 having 16 stages, the relationship between total current consumption of the converter and the scaling factor, and the relationship between total noise in the converter and the scaling factor.

FIG. 15 shows the variation of total current and noise with the scaling factor 1/k in the case of a 16 stage ADC. As FIG. 15 shows, the noise minimum for a given power consumption and the power consumption minimum for a given noise level each occur when the scaling factor 1/k=2.

Although the analysis presented above suggests that scaling of the conversion stages should be applied to all stages of the ADC, in practice scaling of stages cannot continue to the final stage, since for a 16 stage series (17 bit ADC) this would mean that the last stage was $½^{16}$=1/65536 times the size of the first stage.

At a particular stage in the series, when the stage size has become suitably small all the succeeding stages are made the same size, this increases the noise slightly but means that a huge range of sizes is not required.

For example, if scaling stops after six stages, the smallest stage size (used in the sixth and all successive stages) is 1/32 relative to the size of the first stage. In this case total power=

$$1+½+¼+⅛+1/16+1/32+1/32+1/32\ldots$$

Once a minimum stage size is selected, a stage of such size can be designed as a "unit" stage that can be paralleled up (or "stretched" in layout) to form the bigger stages. For example, if the unit stage is of size 1/32 relate to the first stage:

first stage=32 parallel units second stage=16 parallel units third stage=8 parallel units One possible layout on a chip of an ADC employing a unit stage of size 1/32 is shown in FIG. 16.

For a given minimum size of stage, the optimum scaling factor 1/k is still very close to 2, as will be clear from Table 3, which presents the optimum scaling factors for different smallest stage sizes in the case of a 15 stage ADC (16 bits).

Compared to the optimum noise power figure of 4.0 when scaling is not stopped, a smallest stage size of 1/32 results in a total power increase or noise increase of around 10% or 0.46 dB, whereas a minimum stage size of 1/16 increases the power or noise by around 25% or 0.99 dB. These two minimum stage sizes would appear to be good compromises.

TABLE 3

| Smallest Stage Size (first stage = 1) | Minimum overall noise (noise at k = ½) | Optimum scaling factor (1/k) |
|---|---|---|
| small | 4.0 (4.0) | 2.0 |
| 1/256 | 4.03 (4.04) | 1.99 |
| 1/128 | 4.08 (4.08) | 1.99 |
| 1/64 | 4.19 (4.19) | 1.97 |
| 1/32 | 4.44 (4.45) | 1.92 |
| 1/16 | 4.97 (5.02) | 1.83 |
| 1/8 | 6.05 (6.23) | 1.68 |

Scaling such as that described above can usually be applied, in another aspect of the present invention, to any suitable kind of analogue-to-digital converter employing a series of voltage conversion stages. For example, it would be possible to apply scaling to the voltage conversion circuits described in EP-B-0214831 in a case in which a plurality of stages as described in that document were connected together as a series.

The current consumed by the ADC of FIG. 12 is directly proportional to the capacitance of the storage capacitors 2 and inversely proportional to conversion rate. This means that for higher resolution and higher conversion rates the power is of course increased. However, it is estimated that a 16 bit 10 Ms/s converter would consume less than 0.5 W. This suggests that by reducing the conversion rate to 1 Ms/s, the power could be reduced to 50 mW, or 5 mW at 100 ks/s.

For lower resolutions (for example 12 bits), the power and area decrease rapidly since the capacitance can be much smaller; a 12 bit 50 Ms/s converter is estimated to consume 200 mW including the power consumption of the digital logic circuitry required to process the digital data provided by the different conversion stages.

This represents a much improved power/speed trade-off relationship as compared with previously-considered converters. One major reason for this is that each stage m the series can be half the size and power of the previous stage, giving a total power for the converter which is approximately double that of the first stage. This also gives a big reduction in chip size: it is estimated that a 16 bit 10 Ms/s converter would occupy less than $10mm^2$ in a suitable process.

In addition to the voltage doubling circuitry and comparator means, the digital logic circuitry for a N-bit output word ADC comprise $(N-1)^2$ D-type flip-flops and (N−1) full adders, all clocked at the conversion rate. For a 16-bit resolution this gives a basic cell count of about 2000, and a power consumption at 5 V and 10 MHz of about 25% of the estimated analogue power consumption at 16 bit resolution (for 15 bit resolution the analogue power consumption would be reduced by a factor of 4).

As noted above, the gain of each of the amplifier elements 3 of the voltage conversion stages of the ADC should be exactly unity. If they are not, apart from giving rise to a gain error in the transfer function, an additional gain error results because the parasitic capacitances will not be completely bootstrapped out Non-linearity resulting from these errors can be corrected for by adjusting the reference voltage $V_r$ used by each stage slightly along the series of stages, for example, to correct for a 0.1% gain error, $V_r$ may be reduced by 0.1% for each successive stage.

Alternatively, or in addition, the digital data processing means 80 receiving the digital data from each stage may carry out any required correction for voltage conversion errors in the analogue circuitry by adjusting the digital data of the successive stages fractionally.

In order to produce an ADC capable of high speed operation, it is essential that the operation of the switch elements and of the amplifier elements in the stages is sufficiently fast. The unity-gain amplifier elements 3 can be designed to be much faster than conventional operational amplifiers, and SPICE simulations have indicated that a settling time of 50 ns (corresponding to a conversion rate of 10 Ms/s) is practical to 16 bit accuracy in a suitable process. Using depletion mode NMOS buffers and sacrificing some resolution, settling times of 10 ns can be obtained to 12 bit accuracy. This suggests that ADCs based on the FIG. 12 design could be employed in applications such as HDTV.

Circuit noise is not a serious problem in the FIG. 12 ADC, because the noise due to the amplifier elements is effectively reduced by virtue of the doubling of the analogue input voltage before it reaches the amplifier elements. It is conceivable that the amplifier elements can be designed so that they contribute less noise than kT/C noise This kT/C noise is due to thermal noise which limits the accuracy of a given stored voltage sample in any switched capacitor circuit, and prevents very small capacitors from being used. It is estimated that for a 16 bit signal to noise ratio, storage capacitors of at least 10 pF are required in the fist stage, reducing by half in each subsequent stage.

For maximum performance, the FIG. 12 ADC is preferably produced by a p-well (n-substrate) CMOS process, desirably using depletion-mode devices.

It is difficult to obtain sufficiently large voltage swings even with a single 5 V power supply (lower voltage swings mean that lower noise levels are required in the circuitry making up the different stages), and this problem is exacerbated with still lower supply voltages such as 3.3 V.

However, none of the devices in the ADC are exposed to full supply voltage because they are connected in series; only the source/drain diodes are subjected to a higher voltage and even this is not as large as the supply voltage. The largest voltage (5 V) is produced across the well-substrate junction. In view of this, it may be advantageous to use split ±3 V (or ±3.3 V) supplies, with the digital circuits (of minimum Geometry) running from 0 V and +3 V, and the analogue circuits using ±3 V. This split-supply approach also has the major advantage that the input signals can swing either side of 0 V and so can be DC coupled. The digital power consumption is also reduced in accordance with the reduction in the effective digital logic supply voltage and this could give a significant reduction in total power consumption.

Smaller geometry processes can permit an increase in maximum clock rate though not if this is limited by analogue power consumption. The main advantage of split power supplies is therefore increased digital speed and reduced power consumption which would increase the maximum speed of operation of the ADC.

What we claim is:

1. A voltage storage circuit comprising:

a storage capacitor, one plate of which is connected to an input terminal of the circuit by way of an input switch element and the other plate of which is connected to a common terminal of the circuit, to store an input signal being applied between said input and common terminals when the circuit is in use; [and]

an amplifier element, having an input connected to said one plate and an output connected to an output terminal of the circuit, for providing an output signal, between said output and common terminals, dependent upon the voltage stored in said storage capacitor, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate, *said voltage storage circuit being formed on a single substrate, and said input switch element and said input device of the amplifier element being located within one or more wells of the conductivity type opposite to that of the surrounding material of said substrate; and*

*means for causing each well potential to track the potential of said one plate.*

2. A voltage storage circuit as claimed in claim 1, wherein the potential tracking device includes a current source, connected to the said first current-path electrode for causing the first current-path electrode potential to track the control electrode potential, and active follower means connected operatively between the said first and second current-path electrodes for causing the second current-path electrode potential to track the first current-path electrode potential.

3. A voltage storage circuit as claimed in claim 2, wherein the said electronic input device is an FET input transistor and the said control electrode is the gate electrode of the FET input transistor, the first current-path electrode is the source electrode of the FET input transistor, the said second current-path electrode is the drain electrode of the FET input transistor, and the said controllable current path is provided by the drain-source channel of the FET input transistor.

4. A voltage storage circuit as claimed in claim 3, wherein the said active follower means comprise a cascoding FET transistor connected with its drain-source channel in series with the drain-source channel of the said FET input transistor so that the source electrode potential of the cascoding transistor tracks the gate electrode potential thereof and also comprise a bias generator connected operatively between the source electrode of the FET input transistor and the gate electrode of the cascoding transistor for maintaining therebetween a substantially constant potential difference.

5. A voltage storage circuit as claimed in claim 2, wherein the said amplifier element is made up of first and second substantially identical circuit portions, the first portion including the said input device and the said active follower means and the second portion including the said current source.

6. A voltage storage circuit as claimed in claim 1, wherein the said input switch element is an electronic input switch element, operative in dependence upon the potential at a switching electrode thereof, the circuit further including switch driving means connected to cause the switching electrode potential to track the input terminal potential when the element is in its ON condition, thereby maintaining the switching electrode potential substantially fixed in relation to the input terminal potential, and operable to cause the switching electrode potential to change, relative to the input terminal potential such that the element is changed from its ON condition to its OFF condition.

7. A voltage storage circuit as claimed in claim 6, wherein the said switching electrode potential is derived from the said output signal.

8. A voltage storage circuit as claimed in claim 7, wherein the said switch driving means are connected operatively with the said output terminal and are operable, in dependence upon a switching signal received thereby, to apply to the said switching electrode either an ON potential, for maintaining the said input switch element in its ON condition, or an OFF potential, for maintaining the said input switch element in its OFF condition, the said ON and OFF potentials being each substantially fixed in relation to the said output terminal potential but differing from one another by a predetermined amount.

9. A voltage storage circuit as claimed in claim 8, having respective first and second biassing lines connected operatively to the said output terminal so as to be at potentials that are respectively fixed in relation to the output terminal potential, the second biassing line potential being equal to one of the said ON and OFF potentials and the potential difference between the said first and second biassing lines being greater than or equal to the said predetermined amount, wherein the said switch driving means include a bootstrap capacitor one plate of which is connected to the said switching electrode for providing the said switching electrode potential and also include connecting means connected with both plates of the bootstrap capacitor and with the said biassing lines and switchable, when the switching electrode potential is to be changed from the said one of its ON and OFF potentials to the other of those potentials, from a charging configuration, serving to connect the said one plate of the bootstrap capacitor to the said second biassing line whilst connecting the other plate thereof to the said first biassing line, to a floating configuration serving to isolate the said one plate from the second biasing line whilst connecting the said other plate to the said second biassing line, thereby to cause the potential at the said one plate to be changed from the second biassing line potential to a potential differing therefrom by the aid predetermined amount.

10. A voltage storage circuit as claimed in claim 8, having respective first, second and third biasing lines connected operatively to the said output terminal so as to be at potentials that are respectively fixed in ration to the output tern potential, the third biassing line potential being equal to one of the said ON and OFF potentials and the potential difference between the said first and second biassing lines being greater than or equal to the said predetermined amount, wherein the said switch driving means include a bootstrap capacitor one plate of which is connected to the said switching electrode for providing the said switching electrode potential and also include connecting means connected with both plates of the bootstrap capacitor and with the said biassing lines and switchable, when the switching electrode potential is to be changed from the said one of its ON and OFF potentials to the other of those potentials, from a changing configuration, serving to connect the said one plate of the bootstrap capacitor to the said third biassing line whilst connecting the other plate thereof to the said first biassing line, to a floating configuration serving to isolate the said one plate from the third biassing line whilst connecting the said other plate to the said second biassing line, thereby to cause the potential at the said one plate to be changed from the third biassing line potential to a potential differing therefrom by the said predetermined amount.

11. A voltage storage circuit as claimed in claim 8, wherein the said electronic input switch element is a MOSFET transistor and one of the said ON and OFF potentials is substantially the same as the said output terminal potential.

[12. A voltage storage circuit as claimed in claim 1, formed on a single substrate, wherein the said input switch element and the said input device of the amplifier element are located within one or more wells of the conductivity type opposite to that of the surrounding material of said substrate, there being means for causing the or each well potential to track the potential of the said one plate.]

13. A voltage storage circuit as claimed in claim [12] *1*, wherein the said storage capacitor is also located within such a well.

14. A voltage storage circuit as claimed in claim [12] *1*, having one or more conductive shields extending over the area of the or each well, and also having means for causing the or each shield potential to track the potential of the said one plate.

15. A voltage storage circuit as claimed in claim [12] *2*, wherein the said amplifier element is made up of first and second substantially identical circuit portions, the first portion including the said input device and the said active follower means and the second portion including the said current source, and wherein the said first portion of the amplifier element is located within the said one or more wells, and the said second portion of the amplifier element is formed within one or more further wells, each of the conductivity type opposite to that of the surrounding areas of the substrate, the or each further well potential being substantially fixed in relation to the potential of a supply line of the circuit.

16. A voltage storage circuit [as claimed in claim 6, further including] *comprising:*

*an electronic input switch element, operative in dependence upon the potential at a switching electrode thereof;*

*a storage capacitor, one plate of which is connected to an input terminal of the circuit by way of said electronic input switch element and the other plate of which is connected to a common terminal of the circuit, to store an input signal being applied between said input and common terminals when the circuit is in use;*

*switch driving means connected to cause the switching electrode potential to track the input terminal potential when the element is in its ON condition, thereby maintaining the switching electrode potential substantially fixed in relation to the input terminal potential, and operable to cause the switching electrode to change, relative to the input terminal potential, such that the element is changed from its ON condition to its OFF condition;*

*an amplifier element, having an input connected to said one plate and an output connected to an output terminal of the circuit, for providing an output signal, between said output and common terminals, dependent upon the voltage stored in said storage capacitor, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate; and* input potential maintaining means, interposed between the said input terminal and the input side of the said input switch element, for maintaining the input-side potential of the input switch element, after the element is changed to the OFF condition, substantially fixed in relation to the potential of the said one plate of the storage capacitor.

17. A voltage storage circuit as claimed in claim 16, wherein the said input potential maintaining means comprise a further switch element connected in series with the said input switch element and operable, after the said input switch element has been changed to the OFF condition, to isolate the input side of that element from the said input terminal.

18. A voltage storage circuit as claimed in claim 17, wherein the said input potential maintaining means further comprise an auxiliary capacitor connected between the input side of the said input switch element and the said other plate of the said storage capacitor.

19. A voltage storage circuit as claimed in claim 17, wherein the said input potential maintaining means further comprise a feedback switch element connected between the said amplifier element and the input side of the said input switch element and operable, while the input side of that element is so isolated, to apply thereto a potential derived from the potential of the said one plate of the storage capacitor.

20. A voltage storage circuit as claimed in claim 1, wherein the said amplifier element has a gain of substantially unity.

21. Voltage summation circuitry comprising:

first, second and third input nodes to which first, second and third potentials are respectively applied when the circuitry is in use;

a voltage storage circuit including:

a storage capacitor, one plate of which is connected to an input terminal of the circuit by way of an input switch element and the other plate of which is connected to a common terminal of the circuit[, to store an input signal being applied between said input and common terminals when the circuit is in use]; and

[an] *a unity-gain* amplifier element, having an input connected to said one plate and an output connected to an output terminal of the circuit, [for providing an output signal, between said output and common terminals, dependent upon the voltage stored in said storage capacitor] *such that the output terminal potential is substantially equal to the potential of said one plate when the circuit is in use*, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate[, said amplifier element having a gain of substantially unity];

an output node connected with the output terminal of the voltage storage circuit; and switching means connected with said input nodes and with said voltage storage circuit and switchable, after the input switch element of the voltage storage circuit has been changed to the OFF condition, from an input configuration to an output configuration, said input configuration serving to connect said first and second input nodes to said input and common terminals respectively of the voltage storage circuit, thereby to permit storage of the potential difference between said first and second potentials in the storage capacitor of the voltage storage circuit, and said output configuration serving to connect the common terminal of the voltage storage circuit to the third input node, thereby to produce at said output node an output potential which is substantially equal to the sum of the third potential and the stored difference between the first and second potentials.

22. Voltage summation circuitry comprising:

first, second, third, fourth, fifth and sixth input nodes, a first pair of input voltages being applied to said first and second input nodes, a second pair of input voltages being applied to said third and fourth input nodes, and a third pair of input voltages being applied to said fifth and sixth input nodes, when the circuitry is in use;

first and second voltage storage circuits, each of said first and second voltage storage circuits including:

a storage capacitor, one plate of which is connected to an input terminal of the circuit by way of an input switch element and the other plate of which is connected to a common terminal of the circuit[, to store an input signal being applied between said input and common terminals when the circuit is in use]; and

[an] *a unity-gain* amplifier element, having an input connected to said one plate and an output connected to an output terminal of the circuit, [for providing an output signal, between said output and common terminals, dependent upon the voltage stored in said storage capacitor] *such that the output terminal potential is substantially equal to the potential of said one plate when the circuit is in use*, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate[, said amplifier element having a gain of substantially unity];

first and second output nodes connected with the respective output terminals of said first and second voltage storage circuits; and switching means connected with said input nodes and with said voltage storage circuits and switchable, after the respective input switch elements of the first and second voltage storage circuits have been changed to the OFF condition, from an input configuration to an output configuration, said input configuration serving to connect said first and second input nodes to said input and common terminals respectively of said first voltage storage circuit, and also to connect said third and fourth input nodes to said input and common terminals respectively of said second voltage storage circuit, thereby to permit storage, in said storage capacitor of the first voltage storage circuit, of a first potential difference between the two input voltages of said first pair and to permit storage, in said storage capacitor of the second voltage storage circuit, of a second potential difference between the two input voltages of said second pair, and said output configuration serving to connect the respective common terminals of the first and second voltage storage circuits to the fifth and sixth input nodes respectively, thereby to produce between said first and second output nodes a [pair of output voltages the] potential difference [between] which is substantially equal to the sum of the potential difference between the two input voltages of said third pair and the difference between the stored first and second potential differences.

23. Voltage doubling circuitry comprising:

first and second input nodes between which an input voltage to be doubled is applied when the circuitry is in use;

first and second voltage storage circuits, each of said first and second voltage storage circuits including:

a storage capacitor, one plate of which is connected to an input terminal of the circuit by way of an input switch element and the other plate of which is connected to a common terminal of the circuit[, to store an input signal being applied between said input and common terminals when the circuit is in use]; and

[an] *a unity-gain* amplifier element, having an input connected to said one plate and an output connected to an output terminal of the circuit, [for providing an output signal, between said output and common terminals, dependent upon the voltage stored in said storage capacitor] *such that the output terminal potential is substantially equal to the potential of said one plate when the circuit is in use*, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the[.] control electrode potential, whilst current flows in said controllable current path, so that the respective potentials of the first and second current-path electrodes are kept substantially fixed in relation to the potential of said one plate[, said amplifier element having a gain of substantially unity];

first and second output nodes connected respectively with the respective output terminals of the first and second voltage storage circuits; and switching means connected with said input nodes and with said voltage storage circuits and switchable, after the respective input switch elements of the first and second voltage storage circuits have been changed to the OFF condition, from an input configuration to an output configuration, said input configuration serving to connect said first input node to both said input terminal of said first voltage storage circuit and said common terminal of said second voltage storage circuit, and also to connect said second input node to both said input terminal of said second voltage storage circuit and said common terminal of said first voltage storage circuit, thereby to cause each of the respective storage capacitors of said voltage storage circuits to be charged to said input voltage, and said output configuration serving to connect the respective common terminals of the first and second voltage storage circuits together so that said storage capacitors are connected in series with one another between *the respective amplifier-element inputs of* said first and second [output nodes] *voltage storage circuits,* thereby to produce between [those] *said first and second* output nodes an output voltage which is substantially double said input voltage.

24. A voltage conversion stage comprising:

voltage doubling circuitry including:

first and second input nodes between which an input voltage to be doubled is applied when the circuitry is in use;

first and second voltage storage circuits, each of said first and second voltage storage circuits including:

a storage capacitor, one plate of which is connected to an input terminal of the circuit by way of an input switch element and the other plate of which is connected to a common terminal of the circuit[, to store an input signal being applied between said input and common terminals when the circuit is in use]; and

[an] *a unity-gain* amplifier element, having an input connected to said one plate and an output connected to an output terminal of the circuit, [for providing an output signal, between said output and common terminals, dependent upon the voltage stored in said storage capacitor] *such that the output terminal potential is substantially equal to the potential of said one plate when the circuit is in use*, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate[, said amplifier element having a gain of substantially unity];

first and second output nodes connected respectively with the respective output terminals of the first and second voltage storage circuits; and switching means connected with said input nodes and with said voltage storage circuits and switchable, after the respective input switch elements of the first and second voltage storage circuits have been changed to the OFF condition, from an input configuration to an output configuration, said input configuration serving to connect said first input node to both said input terminal of said first voltage storage circuit and said common terminal of said second voltage storage circuit, and also to connect said second input node to both said input terminal of said second voltage storage circuit and said common terminal of said first voltage storage circuit, thereby to cause each of the respective storage capacitors of said voltage storage circuits to be charged to said input voltage, and said output configuration serving to connect the respective common terminals of the first and second voltage storage circuits together so that said storage capacitors are connected in series with one another between *the respective amplifier element inputs of* said first and second [output nodes] *voltage storage circuits*, thereby to produce between [those] *said first and second* output nodes an output voltage which is substantially double said input voltage;

comparator means connected for receiving a working voltage equal to or derived from said input voltage and also connected for receiving a comparison potential and operable to perform a comparison between that working voltage and said comparison potential and to provide digital data indicative of the result of the comparison; and voltage adjustment means connected between the respective common terminals of said first and second voltage storage circuits and operable, after said switching means have been switched from said input configuration to said output configuration, to apply between those terminals an offset voltage having a value selected, by said digital data, from a plurality of preset possible values, thereby to produce between said output nodes an analogue conversion voltage which differs from double said input voltage by the selected offset voltage.

25. A voltage conversion stage as claimed in claim 24, wherein the said comparator means perform the said comparison whilst the switching means of the voltage storage circuits are in the said input configuration.

26. A voltage conversion stage as claimed in claim 24, wherein the said comparator means are connected to the said first and second input nodes, so that the said input voltage is the said working voltage, and provide first such digital data if the said input voltage is less than or equal to minus the said comparison potential, and provide second such digital data if the said comparison potential is less than or equal to the said input voltage, and provide third such digital data in all other cases, and wherein the offset voltage selected by the said second digital data is $-V_{ref}$, where $+V_{ref}$ is the offset voltage selected by the said first digital data, and the offset voltage selected by the said third digital data is zero; the said comparison potential being substantially equal to $V_{ref}/4$.

27. An analogue-to-digital converter comprising:

a series of N stages, each of said N stages being a voltage conversion stage including:

voltage doubling circuitry including:

first and second input nodes between which an input voltage to be doubled is applied when the circuitry is in use;

first and second voltage storage circuits each of said first and second voltage storage circuits including:

a storage capacitor, one plate of which is connected to an input terminal of the circuit by way of an input switch element and the other plate of which is connected to a common terminal of the circuit[, to store an input signal being applied between said input and common terminals when the circuit is in use]; and

[an] *a unity-gain* amplifier element, having an input connected to said one plate and an output connected to an output terminal of the circuit, [for providing an output signal, between said output and common terminals, dependent upon the voltage stored in said storage capacitor] *such that the output terminal potential is substantially equal to the potential of said one plate when the circuit is use*, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate[, said amplifier element having a gain of substantially unity];

first and second output nodes connected respectively with the respective output terminals of the first and second voltage storage circuits; and switching means connected with said input nodes and with said voltage storage circuits and switchable, after the respective input switch elements of the first and second voltage storage circuits have been changed to the OFF condition, from an input configuration to an output configuration, said input configuration serving to connect said first input node to both said input terminal of said first voltage storage circuit and said common terminal of said second voltage storage circuit, and also to connect said second input node to both said input terminal of said second voltage storage circuit and said common terminal of said first voltage storage circuit, thereby to cause each of the respective storage capacitors of said voltage storage circuits to be charged to said input voltage, and said output configuration serving to connect the respective common terminals of the first and second voltage storage circuits together so that said storage capacitors are connected in series with one another between *the respective amplifier element inputs of* said first and second [output nodes] *voltage storage circuits*, thereby to produce between [those] *said first and second* output nodes an output voltage which is substantially double said input voltage;

comparator means connected for receiving a working voltage equal to or derived from said input voltage and also connected for receiving a comparison potential and operable to perform a comparison between that working voltage and said comparison potential and to provide digital data indicative of the result of the comparison; and voltage adjustment means connected between the respective common terminals of said first and second voltage storage circuits and operable, after said switching means have been switched from said input configuration to said output configuration, to apply between those terminals an offset voltage having a value selected, by said digital data, from a plurality of preset possible values, thereby to produce between said output nodes an analogue conversion voltage which differs from double said input voltage by the selected offset voltage, an analogue voltage to be digitised being applied between said first and second input nodes of the first stage of the series, and said first and second input nodes of each successive stage being connected to said first and second output nodes respectively of the immediately-preceding stage;

control means operable to cause the switching means of each of said stages in succession to be switched from said input configuration to said output configuration, such switching being controlled to occur in each of the stages, except for the first stage, at a time when the switching means of the immediately-preceding stage is in the output configuration so that prior to such switching the stage being switched receives as its input voltage the analogue conversion voltage produced by that immediately-preceding stage and so produces its analogue conversion voltage in dependence thereupon after such switching; and data processing means connected for receiving the said digital data provided by said N stages and operative to derive therefrom a digital output word, comprising N+1 bits, representative of the applied analogue voltage.

28. An analogue-to-digital converter as claimed in claim 27, operative alternately in first and second clock phases, wherein the said control means operate in the said first clock phase to maintain the respective switching means of the odd-numbered stages of the series in the input configuration whilst maintaining the respective switching means of the even-numbered stages in the said output configuration but operate in the said second clock phase to maintain the respective switching means of the even-numbered stages in the said input configuration whilst maintaining the respective switching means of the odd-numbered stages in the output configuration.

29. An analogue-to-digital converter as claimed in claim 27, wherein for at least one pair of adjacent stages of the series, the respective storage capacitors of the said first and second voltage storage circuits in the second stage of the pair are smaller in capacitance than the comparable storage capacitors in the first stage of the pair.

30. An analogue-to-digital converter as claimed in claim 29, wherein the storage capacitance ratio of the two stages of one or each such pair is approximately 2:1.

31. An analogue-to-digital converter as claimed in claim 27, wherein for at least one pair of adjacent stages of the series, the respective amplifier element input devices of the said first and second voltage storage circuits in the second stage of the pair are smaller in width than the comparable input devices in the first stage of the pair.

32. An analogue-to-digital converter as claimed in claim 31, wherein the input device width ratio of the two stages of one or each such pair is approximately 2:1.

33. An analogue-to-digital converter as claimed in claim 27, wherein for at least one pair of adjacent stages of the series, the respective currents in the controllable current paths of the amplifier element input devices of the said first and second voltage storage circuits in the second stage of the pair are smaller than the comparable currents in the first stage of the pair.

34. An analogue-to-digital converter as claimed in claim 33, wherein the current ratio of the two stages of one or each such pair is approximately 2:1.

35. An analogue-to-digital converter as claimed in claim 27, wherein in each of the second to nth stages of the converter, where $2 \leqq n \leqq N$, each of the respective storage capacitors of the said first and second voltage storage circuits of the stage has a capacitance that is reduced, relative to the capacitance of the comparable storage capacitor of the immediately-preceding stage, by a first scaling factor that is constant throughout those second to nth stages.

36. An analogue-to-digital converter as claimed in claim 35, wherein the said first scaling factor is approximately 2.

37. An analogue-to-digital converter as claimed in claim 27, wherein in each of the second to nth stages of the converter, where $2 \leqq n \leqq N$, the amplifier element input device of each voltage storage circuit of the stage is of a channel width that is reduced, relative to the channel width of the comparable amplifier element input device of the immediately-preceding stage, by a second scaling factor that is constant throughout those second to nth stages.

38. An analogue-to-digital converter as claimed in claim 37, wherein the said second scaling factor is approximately 2.

39. An analogue-to-digital converter as claimed in claim 27, wherein in each of the second to nth stages of the converter, where $2 \leqq n \leqq N$, the current in each of the said controllable current paths of the amplifier element input devices of the stage is controlled to be reduced, relative to the current in the comparable controllable current path of the immediately-preceding stage, by a third scaling factor that is constant throughout those second to nth stages.

40. An analogue-to-digital converter as claimed in claim 39, wherein the said third scaling factor is approximately 2.

41. An analogue-to-digital converter as claimed in claim 27, wherein, for at least one pair of adjacent stages of the series, at least one of the said preset possible values of the offset voltage in the second stage of the pair is adjusted fractionally as compared with the corresponding preset possible value of the offset voltage in the first stage of the pair.

42. An analogue-to-digital converter as claimed in claim 27, wherein the said data processing means are operable to fractionally adjust the digital data provided by the respective comparator means of successive stages of the series so as to facilitate correction of voltage conversion errors in those successive stages.

43. An analogue-to-digital converter comprising:

first and second stages, each of said stages being a voltage conversion stage including:

voltage doubling circuitry including:

first and second input nodes between which an input voltage to be doubled is applied when the circuitry is in use;

first and second voltage storage circuits, each of said first and second voltage storage circuits including:

a storage capacitor, one plate of which is connected to an input terminal of the circuit by way of an input switch element and the other plate of which is connected to a common terminal of the circuit[, to store an input signal being applied between said input and common terminals when the circuit is in use]; and

[an] *a unity-gain* amplifier element, having an input connected to said one plate and an output connected to an output terminal of the circuit, [for providing an output signal, between said output and common terminals, dependent upon the voltage stored in said storage capacitor] *such that the output terminal potential is substantially equal to the potential of said one plate when the circuit is in use*, which amplifier element includes an electronic input device having a controllable current path provided between respective first and second current-path electrodes of the electronic input device and also having a control electrode to which a potential is applied to control the magnitude of current in said controllable current path, said control electrode being connected to said one plate, and said first and second current-path electrodes being connected with a potential tracking device such that both the first current-path electrode potential and the second current-path electrode potential track the control electrode potential, whilst current flows in said controllable current path, so that the respective potentials of the first and second current-path electrodes are kept substantially fixed in relation to the potential of said one plate[, said amplifier element having a gain of substantially unity];

first and second output nodes connected respectively with the respective output terminals of the first and second voltage storage circuits; and switching means connected with said input nodes and with said voltage storage circuits and switchable, after the respective input switch elements of the first and second voltage storage circuits have been changed to the OFF condition, from an input configuration to an output configuration, said input configuration serving to connect said first input node to both said input terminal of said first voltage storage circuit and said common terminal of said second voltage storage circuit, and also to connect said second input node to both said input terminal of said second voltage storage circuit and said common terminal of said first voltage storage circuit, thereby to cause each of the respective storage capacitors of said voltage storage circuits to be charged to said input voltage, and said output configuration serving to connect the respective common terminals of the first and second voltage storage circuits together so that said storage capacitors are connected in series with one another between *the respective amplifier element inputs of* said first and second [output nodes] *voltage storage circuits*, thereby to produce between [those] *said first and second* output nodes an output voltage which is substantially double said input voltage;

comparator means connected for receiving a working voltage equal to or derived from said input voltage and also connected for receiving a comparison potential and operable to perform a comparison between that working voltage and said comparison potential and to provide digital data indicative of the result of the comparison; and voltage adjustment means connected between the respective common terminals of said first and second voltage storage circuits and operable, after said switching means have been switched from said input configuration to said output configuration, to apply between those terminals an offset voltage having a value selected, by said digital data, from a plurality of preset possible values, thereby to produce between said output nodes an analogue conversion voltage which differs from double said input voltage by the selected offset voltage, said first and second stages *being* connected together such that said first and second output nodes of the first stage are connected to said first and second input nodes respectively of the second stage and said first and second output nodes of said second stage are connected to said first and second input nodes respectively of the first [such] stage, an analogue voltage to be digitised being applied, at the start of an iterative conversion operation of the converter, between said first and second input nodes of said first stage;

control means operable to cause the switching means of the first and second stages to be switched alternately, starting with the first stage, from said input configuration to said output configuration, such switching being controlled to occur in one stage at a time when the switching means of the other stage are in the output configuration so that prior to such switching the one stage being switched receives as its input voltage the analogue conversion voltage produced by the other stage and so produces its analogue conversion voltage in dependence thereupon after such switching; and data processing means connected for receiving said digital data provided alternately by the first and second stages during the course of said iterative conversion operation and operative to derive therefrom a digital output word representative of the applied analogue voltage.

44. An analogue-to-digital converter, operable alternately in first and second clock phases, including:

first and second input nodes between which an analogue input voltage to be digitised can be applied when the converter is in use;

first and second voltage storage circuits, each including respective first and second storage capacitors and a unity-gain amplifier element having respective input and output terminals, which element includes an electronic input device having a controllable current path provided between respective first and second current-path electrodes of the device and also having a control electrode to which a potential is applied to control the magnitude of current in the said current path, the said control electrode being connected to the said input terminal of the amplifier element, and the said first and second current-path electrodes being connected with a potential tracking device such that both the first current-path electrode potential and the second current-path electrode potential track the control electrode potential, whilst current flows in the said controllable current path, so that the respective potentials of the first and second current-path electrodes are kept substantially fixed in relation to the potential of the said input terminal;

input sampling means operable during an initial one of the clock phases to connect the said input terminal of the first voltage storage circuit to the said first input node and to connect the said input terminal of the second voltage storage circuit to the said second input node;

first and second output nodes connected respectively with the amplifier element output terminals of the said first and second voltage storage circuits;

comparator means connected to the said first and second output nodes and also connected for receiving a comparison potential and operable in each clock phase to perform a comparison between the potential difference between the first and second output nodes and the said comparison potential and to provide digital data indicative of the result of the comparison;

voltage adjustment means having a pair of connection terminals and operable in each clock phase to apply between those terminals an offset voltage having a value selected, by the said digital data provided by the said comparator means in the immediately-preceding clock phase, from a plurality of preset possible values;

switching means operable in the first clock phase to connect the two first storage capacitors and the said connection terminals in series between the respective input terminals of the amplifier elements, whilst connecting the said second storage capacitors in parallel with one another between the first and second output nodes, and operable in the second clock phase to connect the two second storage capacitors and the said connection terminals in series between the respective input terminals of the amplifier elements, whilst connecting the said first storage capacitors in parallel with one another between the first and second output nodes; and data processing means connected for receiving the said digital data provided by the said comparator means over a predetermined number of the said clock phases and operative to derive therefrom a digital output word representative of the applied analogue input voltage.

45. An analogue-to-digital converter including a plurality of mutually-similar voltage conversion stages connected in series so that the output of one stage provides an input to the next stage, each stage including a storage capacitor selectively connectible to the input of the stage for storing an input voltage of the stage and also including an amplifier element *connected or* selectively connectible between the storage capacitor and the output of the stage for delivering an output voltage of the stage which is dependent on the stored input voltage, wherein in at least one stage, other than the first stage, of the series the storage capacitor capacitance is smaller than the storage capacitor capacitance of the immediately-preceding stage and/or the width of an input transistor of the amplifier element is smaller than the width of the input transistor of the amplifier element of the immediately-preceding stage.

*46. A voltage storage circuit as claimed in claim 16, wherein the potential tracking device includes a current source, connected to the said first current-path electrode for causing the first current-path electrode potential to track the control electrode potential, and active follower means connected operatively between the said first and second current-path electrodes for causing the second current-path electrode potential to track the first current-path electrode potential.*

*47. A voltage storage circuit as claimed in claim 46, wherein the said electronic input device is an FET input*

*transistor and the said control electrode is the gate electrode of the FET input transistor, the first current-path electrode is the source electrode of the FET input transistor, the said second current-path electrode is the drain electrode of the FET input transistor, and the said controllable current path is provided by the drain-source channel of the FET input transistor.*

*48. A voltage storage circuit as claimed in claim 47, wherein the said active follower means comprise a cascoding FET transistor connected with its drain-source channel in series with the drain-source channel of the said FET input transistor so that the source electrode potential of the cascoding transistor tracks the gate electrode potential thereof and also comprise a bias generator connected operatively between the source electrode of the FET input transistor and the gate electrode of the cascoding transistor for maintaining therebetween a substantially constant potential difference.*

*49. A voltage storage circuit as claimed in claim 46, wherein the said amplifier element is made up of first and second substantially identical circuit portions, the first portion including the said input device and the said active follower means and the second portion including the said current source.*

*50. A voltage storage circuit as claimed in claim 16, wherein the said switching electrode potential is derived from the said output signal.*

*51. A voltage storage circuit as claimed in claim 50, wherein the said switch driving means are connected operatively with the said output terminal and are operable, in dependence upon a switching signal received thereby, to apply to the said switching electrode either an ON potential, for maintaining the said input switch element in its ON condition, or an OFF potential, for maintaining the said input switch element in its OFF condition, the said ON and OFF potentials being each substantially fixed in relation to the said output terminal potential but differing from one another by a predetermined amount.*

*52. A voltage storage circuit as claimed in claim 51, having respective first and second biassing lines connected operatively to the said output terminal so as to be at potentials that are respectively fixed in relation to the output terminal potential, the second biassing line potential being equal to one of the said ON and OFF potentials and the potential difference between the said first and second biassing lines being greater than or equal to the said predetermined amount, wherein the said switch driving means include a bootstrap capacitor one plate of which is connected to the said switching electrode for providing the said switching electrode potential and also include connecting means connected with both plates of the bootstrap capacitor and with the said biassing lines and switchable, when the switching electrode potential is to be changed from the said one of its ON and OFF potentials to the other of those potentials, from a charging configuration, serving to connect the said one plate of the bootstrap capacitor to the said second biassing line whilst connecting the other plate thereof to the said first biassing line, to a floating configuration serving to isolate the said one plate from the second biassing line whilst connecting the said other plate to the said second biassing line, thereby to cause the potential at the said one plate to be changed from the second biassing line potential to a potential differing therefrom by the said predetermined amount.*

*53. A voltage storage circuit as claimed in claim 51, having respective first, second and third biassing lines connected operatively to the said output terminal so as to be at potentials that are respectively fixed in relation to the output terminal potential, the third biassing line potential being equal to one of the said ON and OFF potentials and the potential difference between the said first and second biassing lines being greater than or equal to the said predetermined amount, wherein the said switch driving means include a bootstrap capacitor one plate of which is connected to the said switching electrode for providing the said switching electrode potential and also include connecting means connected with both plates of the bootstrap capacitor and with the said biassing lines and switchable, when the switching electrode potential is to be changed from the said one of its ON and OFF potentials to the other of those potentials, from a charging configuration, serving to connect the said one plate of the bootstrap capacitor to the said third biassing line whilst connecting the other plate thereof to the said first biassing line, to a floating configuration serving to isolate the said one plate from the third biassing line whilst connecting the said other plate to the said second biassing line, thereby to cause the potential at the said one plate to be changed from the third biassing line potential to a potential differing therefrom by the said predetermined amount.*

*54. A voltage storage circuit as claimed in claim 51, wherein the said electronic input switch element is a MOSFET transistor and one of the said ON and OFF potentials is substantially the same as the said output terminal potential.*

*55. A voltage storage circuit as claimed in claim 16, wherein the said amplifier element has a gain of substantially unity.*

*56. An analogue-to-digital converter as claimed in claim 45, having N such stages, wherein in each of the second to nth stages of the converter, where $2 \leqq n \leqq N$, the storage capacitor of the stage has a capacitance that is reduced, relative to the capacitance of the comparable storage capacitor of the immediately-preceding stage, by a first scaling factor that is constant throughout those second to nth stages.*

*57. An analogue-to-digital converter as claimed in claim 56, wherein the voltage gain of each stage is 2 and said first scaling factor is approximately 2.*

*58. An analogue-to-digital converter as claimed in claim 45, having N such stages, wherein in each of the second to nth stages of the converter, where $2 \leqq n \leqq N$, the amplifier element input transistor of the stage is of a channel width that is reduced, relative to the channel width of the comparable amplifier element input transistor of the immediately-preceding stage, by a second scaling factor that is constant throughout those second to nth stages.*

*59. An analogue-to-digital converter as claimed in claim 58, wherein the voltage gain of each stage is 2 and said second scaling factor is approximately 2.*

*60. An analogue-to-digital converter as claimed in claim 45, wherein said amplifier element of each stage has current control means connected to said input transistor for causing a controlled working current to flow therethrough when the converter is in use, the current control means being such that the magnitude of the controlled working current for said one stage is smaller than that for the immediately-preceding stage of the series.*

*61. An analogue-to-digital converter as claimed in claim 60, having N such stages, wherein in each of the second to nth stages of the converter, where $2 \leqq n \leqq N$, said controlled working current for the stage is reduced, relative to said controlled working current in the immediately-preceding stage, by a third scaling factor that is constant throughout those second to nth stages.*

*62. An analogue-to-digital converter as claimed in claim 61, wherein the voltage gain of each stage is 2 and said third scaling factor is approximately 2.*

*63. An analogue-to-digital converter as claimed in claim 45, wherein each stage includes:*

*comparator means operable to compare said input voltage of the stage with a predetermined comparison potential and to produce a digital data signal having a first value if the result of the comparison is that the input voltage is greater than or equal to the comparison potential, a second value if the result of the comparison is that the input voltage is less than minus the comparison potential, and a third value in all other cases; and*

*conversion voltage generating means, connected to said comparator means for receiving therefrom said digital data signal produced thereby, and including said storage capacitor and said amplifier element of the stage, for determining said output voltage of the stage in dependence upon the value of the received digital data signal such that the output voltage is twice the input voltage less a predetermined reference potential when the digital data signal has said first value, and is twice the input voltage plus said predetermined reference potential when the digital data signal has the second value, and is twice the input voltage when the digital data signal has the third value;*

*the converter further comprising data processing means connected for receiving the respective digital data signals produced by the comparator means of the stages and operable to process those signals to produce a digital output word representative of the input voltage of the first stage.*

*64. An analogue-to-digital converter as claimed in claim 44, wherein:*

*each said storage capacitor has a first plate which is the plate thereof that is connectable, by said switching means, to said input terminal of the amplifier element in the voltage storage circuit to which that storage capacitor belongs; and*

*for each said voltage storage circuit:*

*a switch element of the input sampling means that is connected to the amplifier element input terminal, and switch elements of said switching means that are connected to said first plates of the storage capacitors, are formed in one or more wells of the opposite conductivity type to that of the surrounding material of a substrate in which the voltage storage circuit concerned is formed, there being means for causing the or each well potential to be substantially fixed in relation to the output terminal potential of the amplifier element in the voltage storage circuit concerned.*

*65. An analogue-to-digital converter as claimed in claim 44, wherein said input sampling means include, for each said voltage storage circuit:*

*an electronic input switch element, operative in dependence upon the potential at a switching electrode thereof, the voltage storage circuit concerned further including switch driving means connected to cause the switching electrode potential to track the input terminal potential when the element is in its ON condition, thereby maintaining the switching electrode potential substantially fixed in relation to the input terminal potential, and operable to cause the switching electrode potential to change, relative to the input terminal potential, such that the element is changed from its ON condition to its OFF condition; and*

*input potential maintaining means, interposed between said input terminal and the input side of said input switch element, for maintaining the input-side potential of said electronic input switch element, after the element is changed to the OFF condition, substantially fixed in relation to the potential of said input terminal.*

*66. An analogue-to-digital converter as claimed in claim 65, wherein said input potential maintaining means comprise, for each voltage storage circuit, a further switch element connected in series with said input switch element and operable, after said input switch element has been changed to the OFF condition, to isolate the input side of that element from said input terminal.*

*67. An analogue-to-digital converter as claimed in claim 65, wherein said input potential maintaining means further comprise, for each voltage storage circuit, a feedback switch element connected between said amplifier element and the input side of said input switch element and operable, while the input side of that element is isolated, to apply thereto a potential derived from the potential of said input terminal.*

* * * * *